(12) United States Patent
Chainer et al.

(10) Patent No.: US 10,170,392 B2
(45) Date of Patent: Jan. 1, 2019

(54) WAFER LEVEL INTEGRATION FOR EMBEDDED COOLING

(71) Applicant: International Business Machines Corporation, Armonk, NY (US)

(72) Inventors: Timothy Joseph Chainer, Putnam Valley, NY (US); Pritish Ranjan Parida, Fishkill, NY (US); Mark Delorman Schultz, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 32 days.

(21) Appl. No.: 15/479,810

(22) Filed: Apr. 5, 2017

(65) Prior Publication Data
US 2018/0294205 A1    Oct. 11, 2018

(51) Int. Cl.
| | |
|---|---|
| *H01L 23/42* | (2006.01) |
| *H01L 23/46* | (2006.01) |
| *H01L 25/00* | (2006.01) |
| *H01L 23/427* | (2006.01) |
| *H01L 21/82* | (2006.01) |
| *H01L 25/065* | (2006.01) |

(52) U.S. Cl.
CPC .......... *H01L 23/427* (2013.01); *H01L 21/82* (2013.01); *H01L 25/0655* (2013.01); *H01L 25/50* (2013.01)

(58) Field of Classification Search
CPC ..... H01L 23/427; H01L 23/473; H01L 23/46; H01L 25/0655; H01L 25/50
See application file for complete search history.

(56) References Cited

U.S. PATENT DOCUMENTS

| | | | | |
|---|---|---|---|---|
| 4,283,754 | A | 8/1981 | Parks | |
| 4,893,174 | A * | 1/1990 | Yamada | H01L 21/76898 257/621 |
| 5,274,920 | A * | 1/1994 | Matthews | F28F 3/12 165/80.4 |
| 6,209,480 | B1 * | 4/2001 | Moslehi | H01J 37/321 |
| 6,461,754 | B1 * | 10/2002 | Zeng | H01M 8/04029 429/434 |

(Continued)

OTHER PUBLICATIONS

Dang, et al., "Integration and Packaging of Embedded Radial Micro-channels for 3D Chip Cooling," 2016 IEEE 66th Electronic Components and Technology Conference, 7 pages.

(Continued)

*Primary Examiner* — Ida M Soward
(74) *Attorney, Agent, or Firm* — Amin, Turocy & Watson, LLP

(57) ABSTRACT

Techniques for wafer level integration of embedded cooling structures for integrated circuit devices are provided. In one embodiment, a method includes forming channel structures on a first surface of a silicon first wafer, wherein the channel structures respectively include radial channels that extend from central fluid distribution areas, and wherein integrated circuits are formed on a second surface of the silicon first wafer that opposes the first surface. The method can further include bonding a manifold wafer to the first surface of the silicon wafer such that inlet openings formed through the manifold wafer respectively connect to the central fluid distribution areas, thereby enclosing the radial channels and forming a bonded structure.

9 Claims, 30 Drawing Sheets

(56) References Cited

U.S. PATENT DOCUMENTS

| | | | |
|---|---|---|---|
| 7,435,623 B2* | 10/2008 | Chrysler | H01L 23/473 257/E21.499 |
| 7,762,314 B2* | 7/2010 | Campbell | F28F 3/02 165/80.3 |
| 7,795,726 B2 | 9/2010 | Myers et al. | |
| 7,928,563 B2* | 4/2011 | Bakir | H01L 23/473 257/686 |
| 7,990,711 B1 | 8/2011 | Andry et al. | |
| 8,030,208 B2 | 10/2011 | Leung et al. | |
| 8,406,369 B2* | 3/2013 | Sakata | G21C 3/322 376/347 |
| 8,418,751 B2 | 4/2013 | Bezama et al. | |
| 8,546,930 B2 | 10/2013 | Bakir et al. | |
| 8,921,992 B2 | 12/2014 | Koontz et al. | |
| 9,648,782 B2* | 5/2017 | Brunschwiler | H05K 7/20381 |
| 2001/0055812 A1* | 12/2001 | Mian | B01F 13/0059 436/45 |
| 2008/0179736 A1* | 7/2008 | Hartwell | H01L 23/473 257/714 |
| 2014/0071628 A1 | 3/2014 | Brunschwiler et al. | |
| 2014/0264759 A1 | 9/2014 | Koontz et al. | |
| 2015/0325772 A1* | 11/2015 | Boukai | H01L 35/34 438/54 |
| 2016/0053314 A1* | 2/2016 | Jovanovich | B01F 11/0071 506/37 |
| 2016/0165758 A1 | 6/2016 | Brunschwiler et al. | |
| 2016/0249490 A1* | 8/2016 | Shepard | H01F 27/08 |
| 2018/0082888 A1* | 3/2018 | Hung | H01L 21/76251 |

OTHER PUBLICATIONS

Anonymous, et al., "Method for microchannel reservoir through-holes," An IP.com Prior Art Database Technical Disclosure, Electronic Publication Date: Jan. 6, 2007, 7 pages.

Anonymous, et al., "3D Chip Stack Packaging Enclosures," An IP.com Prior Art Database Technical Disclosure, Electronic Publication Date: Nov. 16, 2015, 7 pages.

Brunschwiler, et al., "Chip Package for Two-Phase Cooling and Assembly Process Thereof," U.S. Appl. No. 15/266,786, filed Sep. 15, 2016, 33 pages.

Sridhar, et al., "Study of Two-phase Pressure Drop and Heat Transfer in a Micro-scale Pin Fin Cavity: Part A," 2016 5th IEEE Intersociety Conference on Thermal and Thermomechanical Phenomena in Electronic Systems (ITherm) Year: 2016, pp. 337-344, DOI: 10.1109/ITHERM.2016.7517568.

* cited by examiner

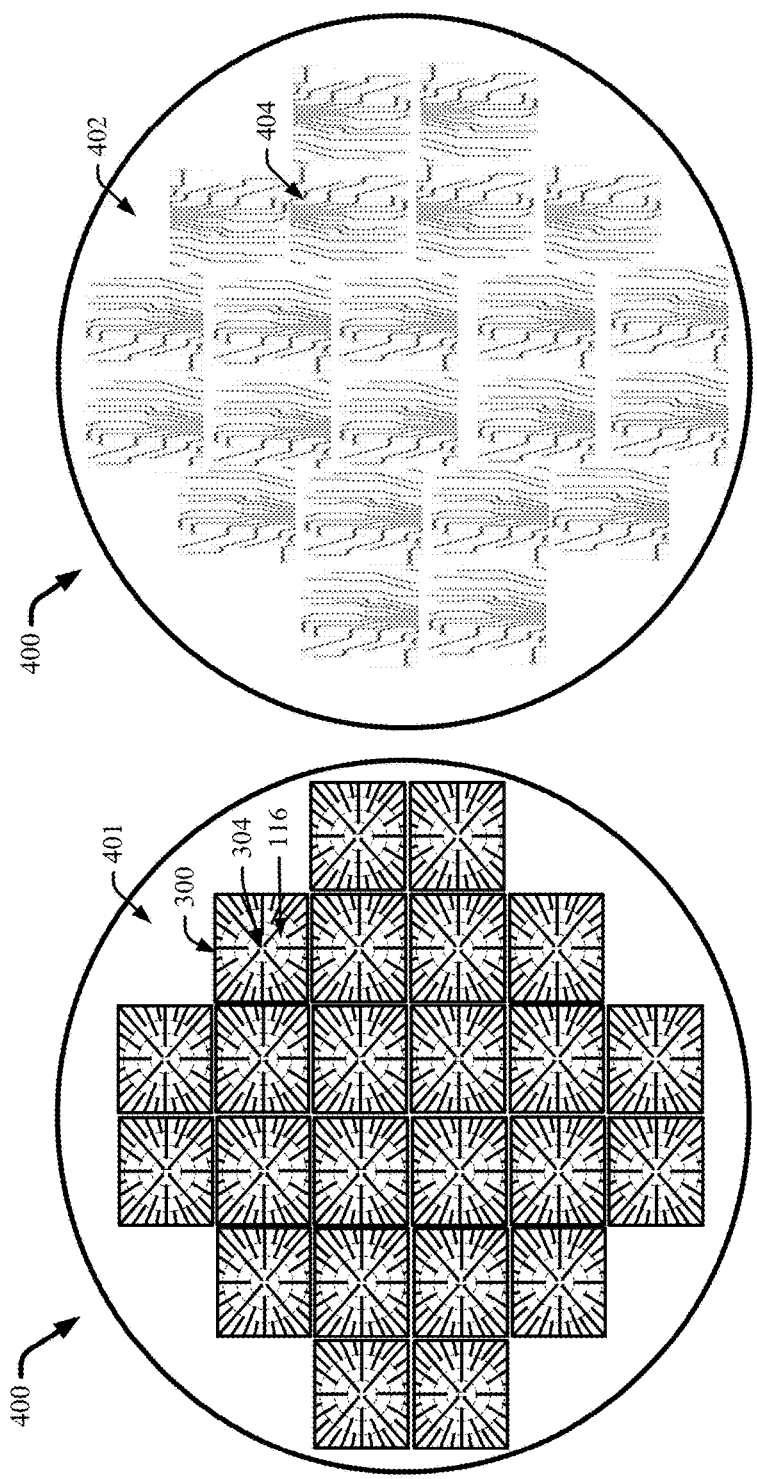

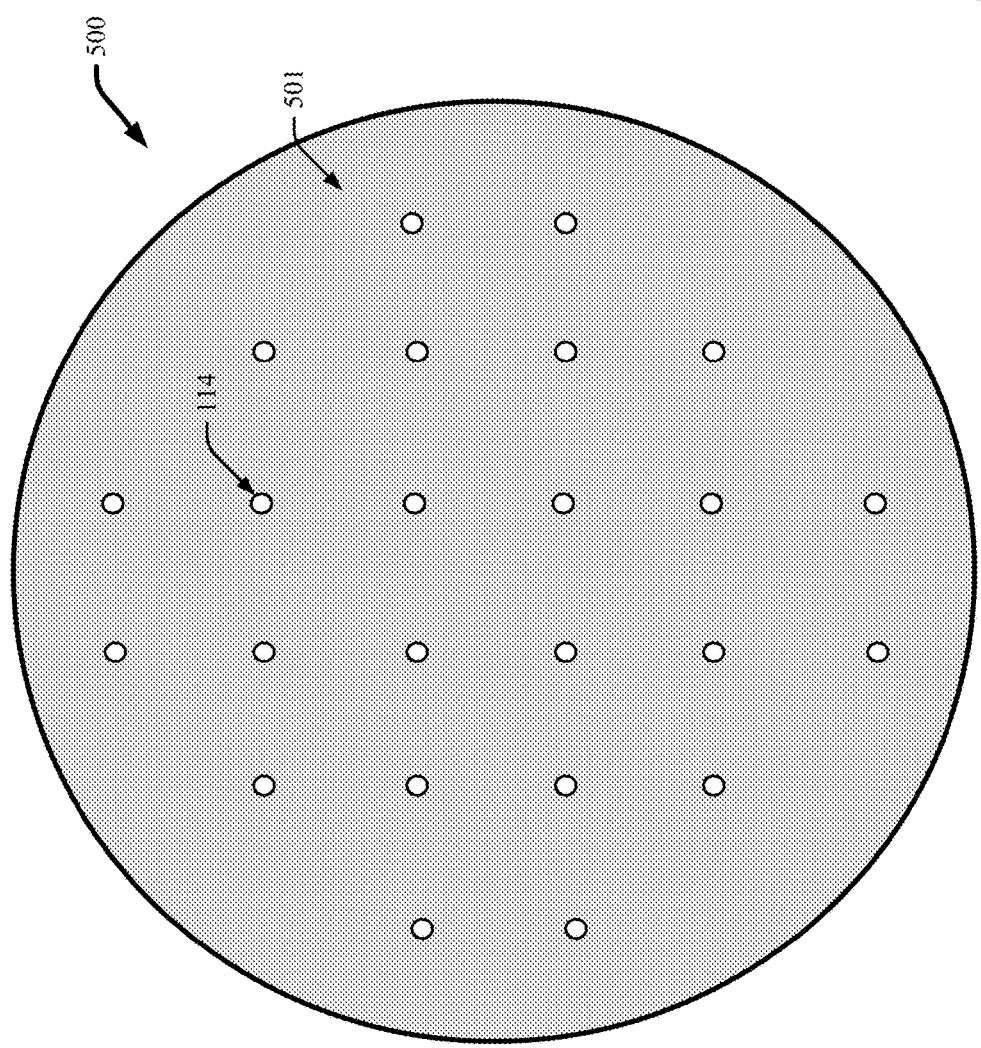

WAFER LEVEL INTEGRATION FOR EMBEDDED COOLING

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights in this invention.

BACKGROUND

The subject disclosure relates to wafer level integration for embedded cooling.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices and methods that facilitate wafer level integration of embedded cooling structures for integrated circuit devices are described.

According to an embodiment, a method is provided. The method includes forming channel structures on a first surface of a silicon first wafer, wherein the channel structures respectively comprise radial channels that extend from central fluid distribution areas, and wherein integrated circuits are formed on a second surface of the silicon first wafer that opposes the first surface. The method can further include bonding a manifold wafer to the first surface of the silicon wafer such that inlet openings formed through the manifold wafer respectively connect to the central fluid distribution areas, thereby enclosing the radial channels and forming a bonded structure.

According to another embodiment, another method is provided that comprises forming channel structures on a first surface of a manifold first wafer, wherein the channel structures respectively comprise radial channels that extend from central fluid distribution areas. The method further comprises bonding the first surface of the manifold wafer to a first surface of a silicon wafer, thereby enclosing the radial channels and forming a bonded structure.

In another embodiment, a device is provided that comprises a silicon wafer, the silicon wafer comprising channel structures formed on a first surface of a silicon first wafer, wherein the channel structures respectively comprise radial channels that extend from central fluid distribution areas. The silicon wafer further comprises integrated circuits formed on a second surface of the silicon first wafer that opposes the first surface. The device further comprises a manifold wafer bonded to the first surface of the silicon wafer, wherein portions of the manifold wafer enclose the radial channels and wherein inlet openings formed through the manifold wafer respectively connect to the central fluid distribution areas.

BRIEF DESCRIPTION OF THE DRAWINGS

FIGS. 4A and 4B illustrate top-down planar views of an example silicon wafer in accordance with one or more embodiments described herein.

FIG. 5 illustrates a top-down planar view of an example manifold wafer in accordance with one or more embodiments described herein.

DETAILED DESCRIPTION

Figure 1:
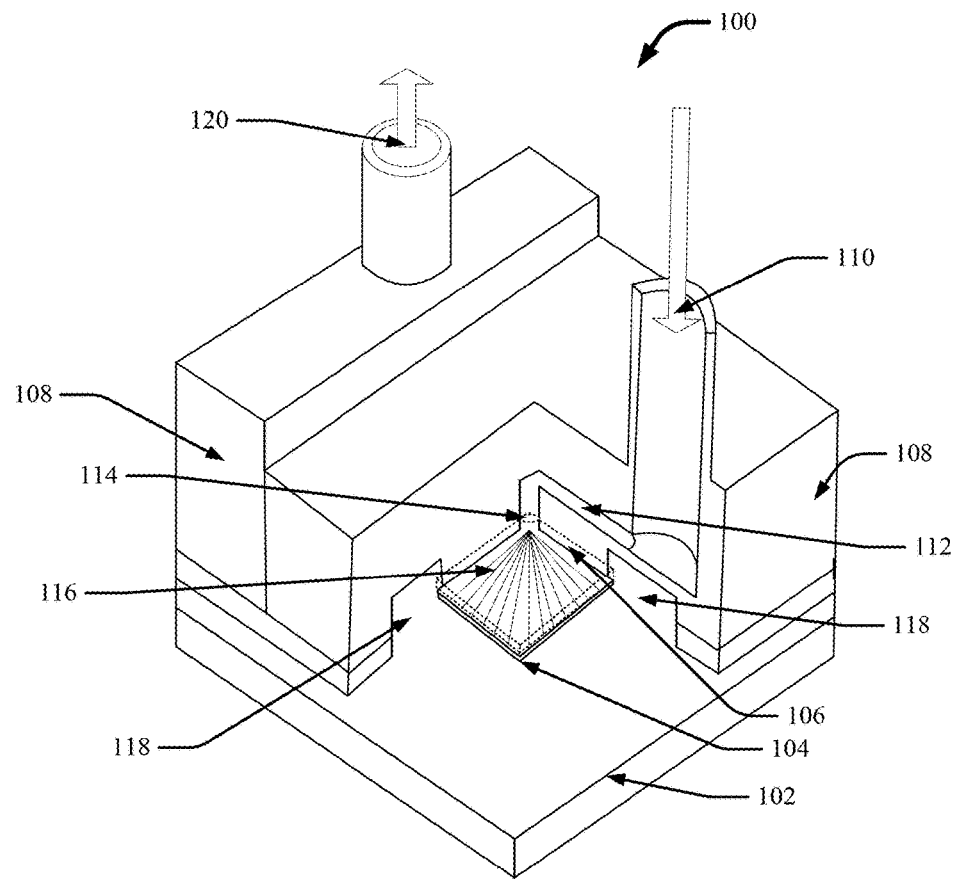
FIG. 1 illustrates a schematic of an example, non-limiting device having an integrated cooling architecture to implement two-phase cooling in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

As conventional high performance integrated circuit chips are fabricated smaller and smaller, the reduced form factor can result in an increase of power density within these smaller devices. As such, a high-performance integrated circuit chip can generate large amounts of heat which can negatively affect the operation and performance of the device. Various solutions have been developed to aid heat extraction from a high-performance integrated circuit chip. With single-phase cooling, coolant is passed through the micro-channels and heated by the electronic device. The heated coolant is then excreted from the micro-channels and passed to a liquid to liquid condenser/heat exchanger that transfers the heat from the heated coolant. In two-phase cooling, instead of excreting heated liquid coolant, the liquid coolant is boiled from the micro-channels as it passes there through and vapor is excreted from the micro-channels to a condenser. Two-phase cooling systems can provide greater cooling ability at a lower volume of coolant, lower mass flow rate, and/or lower operating pressure than single-phase cooling.

One or more embodiments of the subject disclosure provide techniques for efficiently forming two-dimensional (2D) integrated circuit chips or chip stacks with embedded cooling structures, also referred to herein as cold plates, at the wafer level. In this regard, a plurality of micro-channel structures can be formed within a bonded structure comprising a silicon wafer that is bonded to a manifold wafer. The silicon wafer can comprise a plurality of integrated circuits formed on a first surface thereof. In one embodiment, the micro-channel structures can be patterned on a second surface of the silicon wafer. With this embodiment, the manifold wafer can be bonded to the second surface of the silicon wafer so as to enclose the micro-channels. The manifold wafer can further include a plurality of openings that respectively connect to the micro-channel structures and provide for passing liquid coolant into the micro-channels. In another embodiment, the micro-channel structures can be formed on a first surface of the manifold layer. With this embodiment, the first surface of the manifold wafer can be bonded to the second surface of the silicon wafer so as to enclose the micro-channels. The manifold wafer can also include a plurality of openings that respectively connect to the micro-channel structures and provide for passing liquid coolant into the micro-channels. In some implementations, in either of these embodiments, the silicon wafer and the manifold wafer can be thermally bonded to facilitate heat transfer from the integrated circuit to the micro-channels.

The bonded structure can then be diced into individual integrated circuit chip structures such that each of the integrated circuit chips structures includes at least one integrated circuit and a micro-channel structure (or cold plate). In various implementations, the embedded cooling structures can provide for two-phase cooling. With these implementations, the manner in which the bonded structure is diced can facilitate exposing one or more openings in the micro-channels to allow liquid vapor to exist the micro-channels. In some implementations, the embedded cooling structures can also provide for single-phase cooling. In one or more embodiments, a chip package can be formed by mounting an individual integrated circuit chip structure onto a substrate and forming a lid or cap over the integrated circuit chip structure so as to enclose the integrated circuit chip structure on the substrate. A first (inlet) opening can further be formed through the cap that connects to an opening in the manifold layer which further connects to the micro-channels of the cold plate to provide for passage of liquid coolant into the micro-channels. A second (outlet) opening can be formed within the cap that allows for excretion of heated coolant or vapor from the micro-channels outside of the chip package.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

With reference now to FIG. 1, an embodiment is shown wherein a chip package 100 for two-phase cooling is illustrated with a corner of the chip package 100 cut away to render the inner structure visible. The chip package 100 can comprise a substrate 102, a chip 104, a manifold 106 (indicated by the dashed box), and a cap 108. A dielectric liquid coolant can enter the cap 108 via an inlet opening 110, and traverse an inlet path 112 through the cap 108 to the manifold 106. The liquid coolant can pass through the manifold 106 via an opening 114 and enter one or more cooling channels 116 on an upper surface of the chip 104. The one or more cooling channels 116 can radially extend away from the center of the chip 104. The liquid coolant can flow through the cooling channels 116 towards the edges of the chip 104 and manifold 106. As the coolant flows through the cooling channels 116, the coolant can absorb heat dissipating from the chip 104 and change phase from a liquid to a vapor. Upon reaching the end of the cooling channels 116, the gaseous coolant can escape into an outlet path 118 in the cap 108 and which surrounds the chip 104 and manifold 106. The gaseous coolant can flow through the outlet path 118 and exit the chip package 100 via an outlet opening 120.

Figure 2:
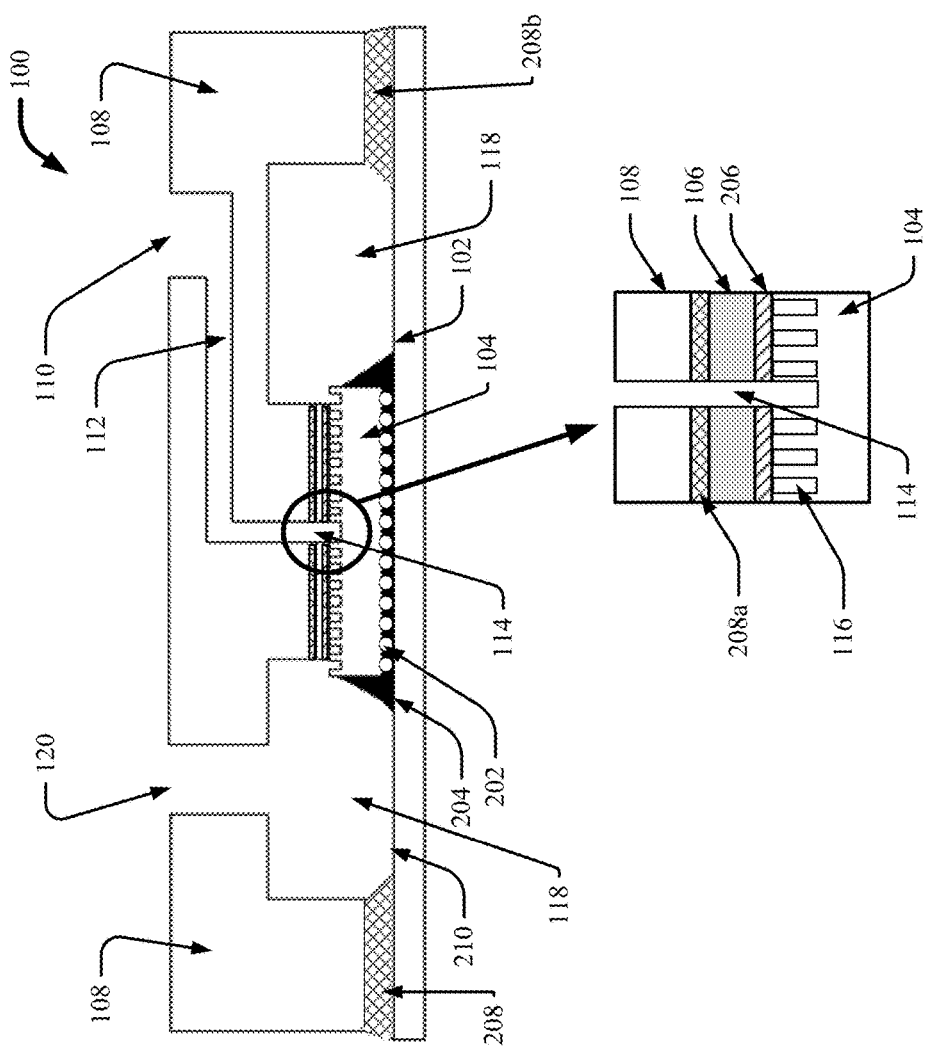
FIG. 2 illustrates a cross-sectional view of an example, non-limiting device having an integrated cooling architecture to implement two-phase cooling in accordance with one or more embodiments described herein.

FIG. 2 illustrates a cross-sectional view of the chip package 100 with a portion of the chip package 100 magnified for more accurate referencing. Repetitive description of like elements employed in other embodiments described herein is omitted for sake of brevity.

The substrate 102 (e.g., an organic substrate) can comprise the base of the chip package 100. The chip 104 (e.g., a silicon chip), or a stack of conjoined chips, can be electrically connected and bonded to the substrate 102 via an array of solder balls 202 (e.g., Lead (Pb)-free controlled collapse chip connections (C4s)). The chip 104 can be underfilled with a cured underfill 204 to protect both the solder interconnections and fragile back-end-of-line structure in an area of connection on the chip 104 from cyclic thermal mechanical fatigue failure. The material properties of the cured underfill 204 can result in a strong mechanical bond between the chip 104, with a low coefficient of thermal expansion (CTE) (about 2.9 parts per million (ppm)/degrees Celsius (C°)), and the substrate 102, with a much higher CTE (about 17 ppm/C°). Further, a laminate 210 can coat an upper most surface of the substrate 102 that faces the cap 108.

In the embodiment shown, the cooling channels 116 can be etched into a surface of the chip 104 farthest from the substrate 102 (e.g., a top surface of the chip 104). In other embodiments, the cooling channels 116 may be etched into other (e.g., intermediary) surfaces of the chip 104. In some embodiments, the cooling channels 116 can be formed around a central fluid distribution area that is aligned with the opening 114 that extends through the manifold 106. Further, the cooling channels 116 can extend radially from the central fluid distribution area toward the edges of the chip 104. Also, the width of the cooling channels 116 can increase as the cooling channels 116 near one or more of the chip 104 edges. Each channel (or in some embodiments, one or more channels) of the cooling channels 116 can have the same height as the other channels comprising the cooling channels 116. The cooling channels 116 can guide the coolant into a radial flow across the surface of the chip 104.

In some embodiments, the manifold 106 can be located on the chip 104 and form a lid over the cooling channels 116. The opening 114 in the manifold 106 can be aligned with the central fluid distribution area of the cooling channels 116. Further, the manifold 106 can cover the entire surface of the chip 104 except for the opening 114 over a defined region (e.g., the center region) of the chip 104. Also, in some embodiments, the manifold 106 can stop short of extending entirely to the edges of the chip 104, thereby creating an opening enabling greater fluid communication between the cooling channels 116 and the outlet path 118. In other words, the manifold 106 can act as a lid covering the cooling channels 116 and containing the dielectric coolant (in liquid or vapor phase) except over the central fluid distribution area and outmost edges of the cooling channels 116.

In some embodiments, the manifold 106 can be a thin flexible material having a CTE closely matched to the CTE of the chip 104. Material choices for the manifold 106 can include, but are not limited to, thin silicon (<500 microns), thin glass (<200 microns) (e.g., WILLOW GLASS®) and the like. Thus, suitable materials for the manifold 106 can include materials that are thin (typically less than 1 millimeter (mm)), flexible, and have similar CTE properties as the chip 104 material. Further, the manifold 106 can have a uniform thickness.

The manifold 106 can be bonded to the chip 104 by a bonding layer 206. The bonding layer 206 can bond the manifold 106 to the surface of the chip 104 into which the cooling channels 116 are etched (e.g., the top of the walls defining the cooling channels 116). The opening 114 can also extend through the bonding layer 206. In one or more exemplary embodiments, the bonding layer 206 comprises copper or another suitable metal and is formed via soldering. In other embodiments, the bonding layer 206 can comprise an anodic bond. Still in other embodiments, the bonding layer 206 can comprise an adhesive malleable enough to contour with any (or, in some embodiments, one or more) curvatures of the manifold 106 and the chip 104. The bonding layer 206 can be a phenoxy thermoplastic adhesive (e.g., a synthetic thermoplastic in the form of polyhydroxy ethers). For example, the adhesive can comprise a phenoxy polymer containing the chemical ingredient bisphenol-A-(epichlorohydrin) (e.g., PKHC, PKHB, PKHJ, PKHA, and PKHH), or the like in a solvent (e.g., N-Methyl-2-pyrrolidone (NMP), Methyl Ethyl Ketone (MEK), cyclohexanone, and glycol ethers). Also, the adhesive layer can be about 2-5 microns thick (e.g., 3-4 microns). In various exemplary embodiments, the bonding layer 206 comprises a thermally conductive material. In this regard, the thermally conductive bonding layer can improve thermal performance by serving as an additional path for heat transfer from the chip 104 (and associated elements) to the cooling channels 116.

The cap 108 can interact with the manifold 106 and the laminated substrate 102 via an interface 208. The interface 208 can be located in primarily two positions. The first position 208a of the interface 208 can be between the cap 108 and the manifold 106. The second position 208b of the interface 208 can be between the cap 108 and the laminated substrate 102. In some embodiments, the interface 208 can encircle the opening 114 on the manifold 106 at the first position 208a and traverse the perimeter of the laminated substrate 102 at the second position 208b.

In some embodiments, the interface 208 can be a rigid high strength, room temperature curing structural adhesive with a modulus of elasticity of about 2 gigapascals (GPa) or more at both the first position 208a and the second position 208b. The interface 208 can comprise about 28-32 milligrams (mg) of adhesive at the first position 208a, wherein the chip 104 can be about 21.2×26.6 mm in size, and about 500-600 mg of adhesive at the second position 208b, wherein the substrate 102 can be about 50×50 mm and the cap can be about 48×48 mm in size. Also, it is understood that the mass dispense of the adhesive can be adjusted for various design dimensions. Further, in one embodiment, 45 micron spacer beads can be used in the adhesive to achieve a 45 micron bond line minimum at the first position 208a.

In another embodiment, the interface 208 at the first position 208a can be a compliant, elastomeric adhesive with a modulus of about 2 to 15 megapascals (MPa). The interface 208 at the second position 208b can be a rigid high strength, room temperature curing structural adhesive with a modulus of elasticity of about 2 GPa or more. The interface 208 can comprise about 28-32 mg of compliant adhesive at the first position 208a and about 500-600 mg of rigid adhesive at the second position 208b. Spacer beads larger than 45 microns can be used to facilitate compliance in the structure with a corresponding increase in the mass of adhesives dispensed at the first position 208a and the second position 208b.

In another embodiment, the interface 208 at the first position 208a can be a compliant, elastomeric pre-cast or pre-cut non-adhesive seal with a modulus of about 2 to 15 MPa, and can be used to provide compressive loading during room temperature curing and provide a large temperature range of thermal mechanical stability of the chip package 100 structure. The interface 208 at the second position 208b can be a rigid high strength, room temperature curing structural adhesive with a modulus of elasticity of about 2 GPa or more. The interface 208 can comprise about 500-600 mg of rigid adhesive at the second position 208b.

The cap 108 (e.g., a manifold typically comprising a brass alloy, a copper alloy, or an aluminum alloy but can comprise a polymer, ceramic or other material) can have at least one inlet opening 110 connected to least one inlet path 112. The inlet path 112 can travel through the cap 108 and align with the opening 114 in the manifold 106. As such, a pathway can be created in which dielectric coolant can pass through the cap 108 and the manifold 106 to the central fluid distribution area and into the cooling channels 116. Further, the cap 108 can have at least one outlet path 118 surrounding the chip 104, bonding layer 206, manifold 106, and first position 208a of the interface 208. The at least one outlet path 118 can connect to at least one outlet opening 120. As such, a pathway can be created in which heated dielectric coolant (e.g., liquid and/or vapor) can escape the cooling channels 116 and exit the chip package 100.

Figure 3:
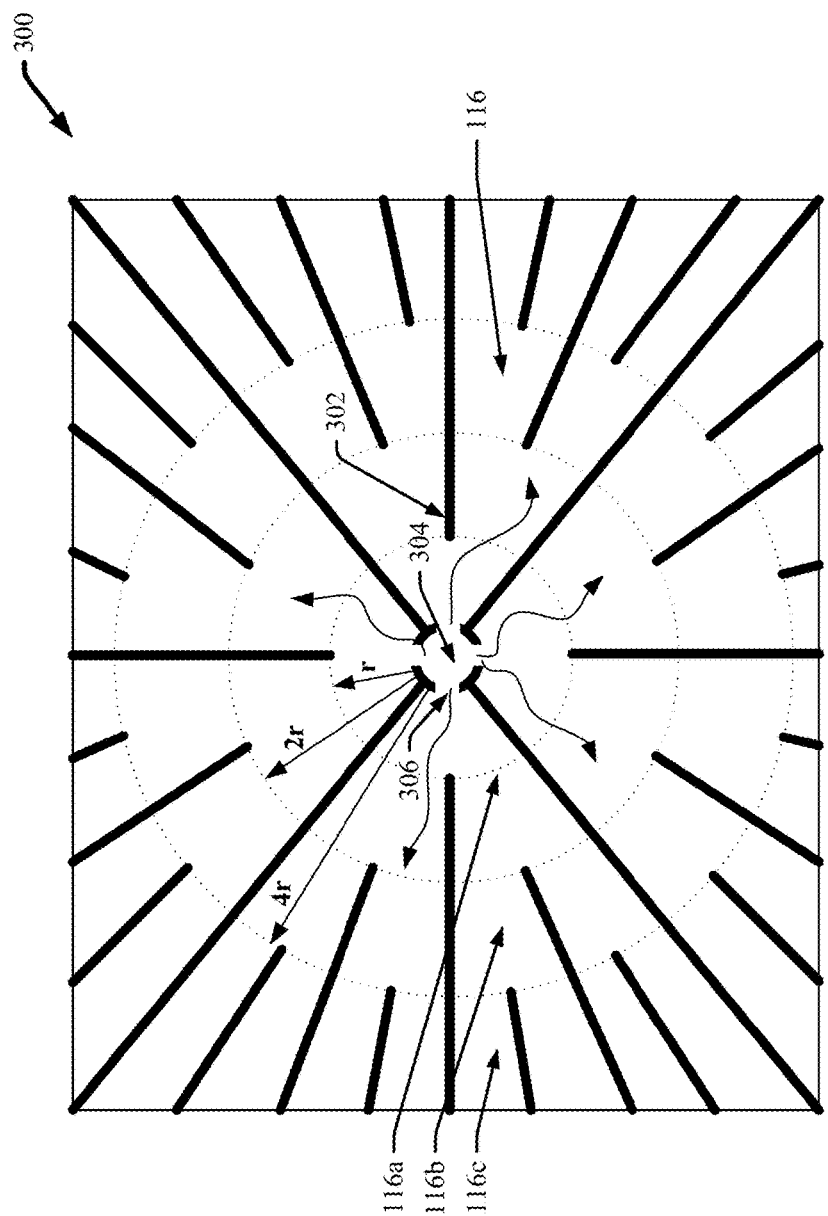
FIG. 3 illustrates a top-down planar view of example channel structure in accordance with one or more embodiments described herein.

FIG. 3 illustrates a top-down planar view of an example cooling channel structure 300 in accordance with one or more embodiments described herein. Repetitive description of like elements employed in other embodiments described herein is omitted for sake of brevity.

The cooling channel structure 300 includes a plurality of cooling channels 116 (represented by the open white spaces) defined by walls 302 (represented by the thick black lines). The cooling channels 116 radially extend from a central fluid distribution area 304. The central fluid distribution area 304 can connect with the opening 114 in the manifold 106 (and in some embodiments, aligned openings in the bonding layer 206 and/or the interface 208) which connects to the inlet path 112. Liquid coolant can enter the central fluid distribution area 304 via the opening 114 and be radially dispersed via one more openings 306 in the central fluid distribution area 304 (as indicated by the squiggly arrow lines). In the embodiment shown, the cooling channels 116 can branch into smaller sub-channels as they extend radially from the central fluid distribution area 304. For example, channel 116a, can branch into sub-channels 116b, which can branch into sub-channels 116c based on formation of the walls 302 at various increasing radii (e.g., r, 2r, 4r, etc.) from the central fluid distribution area 304. Each channel (or in some embodiments, one or more channels) of the cooling channels 116 can have the same depth (or height) as the other channels comprising the cooling channels 116.

FIGS. 4A and 4B illustrates top-down planar views of an example silicon wafer 400 comprising a plurality of cooling channel structures (e.g., a plurality of cooling channel structures 300) formed on a surface of the silicon wafer 400 in accordance with one or more embodiments described herein. FIG. 4A illustrates a top-down planar view of the first surface 401 (e.g., the topside) of the silicon wafer 400 and FIG. 4B illustrates a top-down planar view of the second surface 402 (e.g., the backside) of the silicon wafer 400. Repetitive description of like elements employed in other embodiments described herein is omitted for sake of brevity.

In one embodiment, in order to efficiently (e.g., in terms of time and cost) fabricate a plurality of chip packages with embedded cooling (e.g., such as chip packege 100 or similar chip packages), a plurality of cooling channel structures 300 can be formed on one surface (e.g., the first surface 401) of a silicon wafer 400 using a suitable etching technique (e.g., deep reactive ion etching (RIE), a wet etchant, or the like). The cooling channels 116 of the respective cooling channel structures 300 on the first surface 401 of the silicon wafer 400 are exposed. The particular number and arrangement of the respective cooling channel structures 300 can vary. According to this embodiment, the other side of the silicon wafer (e.g., the second surface 402) can include a plurality of integrated circuits 404 formed thereon that respectively oppose the cooling channel structures 300. For example, one or more of the integrated circuits 404 can include an application-specific integrated circuit (ASIC), a staggered pin grid array (SPGA), or another suitable integrated circuit. The depth of the cooling channels 116 of the respective cooling channel structures 300 can vary such that they extend partially through the thickness of the silicon wafer 400 and do not puncture the integrated circuits formed on the backside of the silicon wafer 400. In some implementations, the integrated circuits 404 can be formed on the second surface 402 of the silicon wafer prior to formation of the cooling channel structures 300 on the first surface 401 of the silicon wafer 400. In other implementations, the integrated circuits 404 can be formed on the second surface 402 of the silicon wafer after the formation of the cooling channel structures 300 on the first surface 401 of the silicon wafer 400.

FIG. 5 illustrates a top-down planar view of an example manifold wafer 500 in accordance with one or more embodiments described herein. The material of the manifold wafer 500 can be or include one or more of the materials of the manifold 106 discussed supra. Repetitive description of like elements employed in other embodiments described herein is omitted for sake of brevity.

In accordance with the subject embodiment, the manifold wafer 500 can include a plurality of openings 114 can extend throughout the entire thickness of the manifold wafer 500 such that liquid coolant can pass through the respective openings from one side of the manifold wafer to the other. According with this embodiment, the first surface 501 and the second opposing surface (not show) of the manifold wafer 500 can be the same or substantially the same. The openings 114 can be arranged such that their positions correspond to the respective positions of the central fluid distribution areas (e.g., central fluid distribution area 304) of the respective cooling channel structures on the silicon wafer 400. Thus when the manifold wafer 500 is subsequently bonded to the first surface 401 of the silicon wafer 400, the respective openings 114 can be aligned with and connect to the respective central fluid distribution areas 304.

FIGS. 6A-6D illustrate a method for wafer level integration of embedded cooling in accordance with one or more embodiments described herein. Repetitive description of like elements employed in other embodiments described herein is omitted for sake of brevity.

Figure 6A:
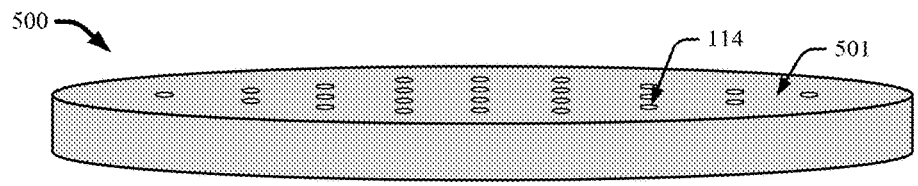
FIGS. 6A-6D illustrate an example method for forming a bonded structure that facilitates wafer level integration of embedded cooling in accordance with one or more embodiments described herein.
Figure 6B:
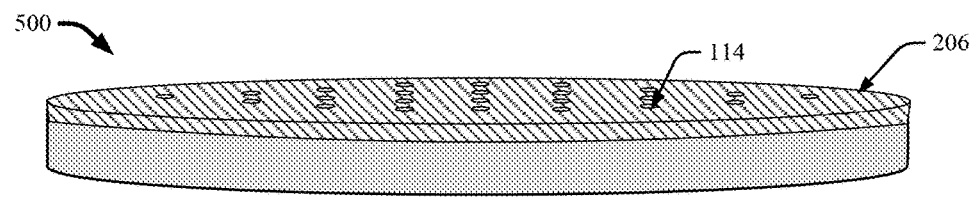

With reference to FIGS. 6A and 6B, according to the embodiment shown, a bonding layer 206 can be formed on the first surface 501 of the manifold wafer 500 such that the bonding layer 206 exposes at least the openings 114 of the manifold layer. In implementations in which the manifold wafer 500 comprises silicon, the bonding layer 206 can comprise a copper bond, a solder bond, or an adhesive bond. In other implementations in which the manifold wafer comprises glass, the bonding layer 206 can comprise a copper bond, a solder bond, or an adhesive bond. In various exemplary implementations, the bonding layer 206 comprises a thermally conductive material. Other suitable materials for the bonding layer 206 are discussed supra with reference to FIG. 2. Although the bonding layer 206 is shown substantially covering the first surface 501 (aside from openings 114) of the manifold wafer 500, it should be appreciated that the amount of coverage of the bonding layer 206 on first surface 501 of the manifold wafer 500 can cover less than the entire surface based on the type of bonding material/method used.

Figure 6C:
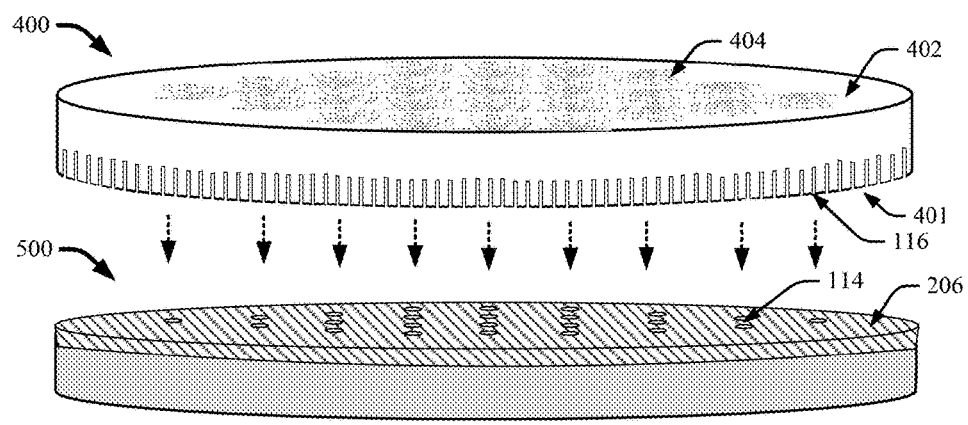
Figure 6D:
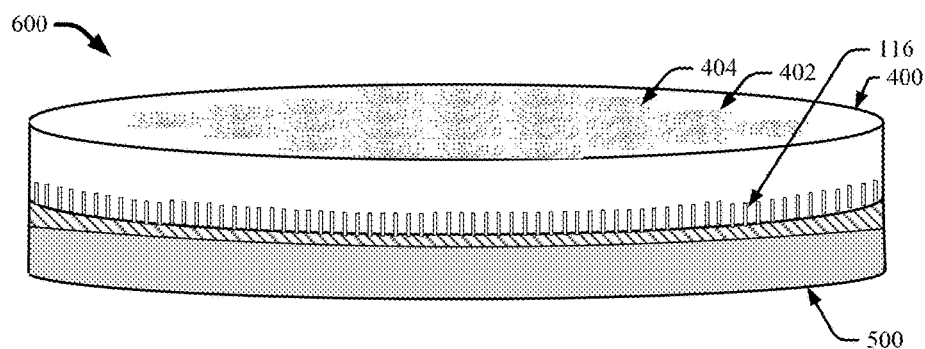

As shown in FIG. 6C, the first surface 401 of the silicon wafer 400 can further be bonded to the manifold wafer 500 via the bonding layer 206 formed on the first surface 501 of the manifold wafer 500 so as to enclose the cooling channels 116 exposed on the first surface 401 of the silicon wafer 400. In addition, the openings 114 in the manifold wafer 500 can be aligned with the respective central fluid distribution areas 304 of the cooling channel structures 300 formed on the first surface 401 of the silicon wafer 400. The resulting bonded structure 600 is shown in FIG. 6D. In another embodiment, (not shown), the bonding layer 206 can be formed on the first surface 401 of the silicon wafer 400. For example, the bonding layer 206 can be formed on the top surfaces of the walls 302 of cooling channel structures 300. The first surface 401 can further be bonded to the first surface 501 or the second surface 502 of the manifold wafer 500 via the bonding layer 206 formed on the top surfaces of the walls 302 of the cooling channels 116.

Figure 7A:
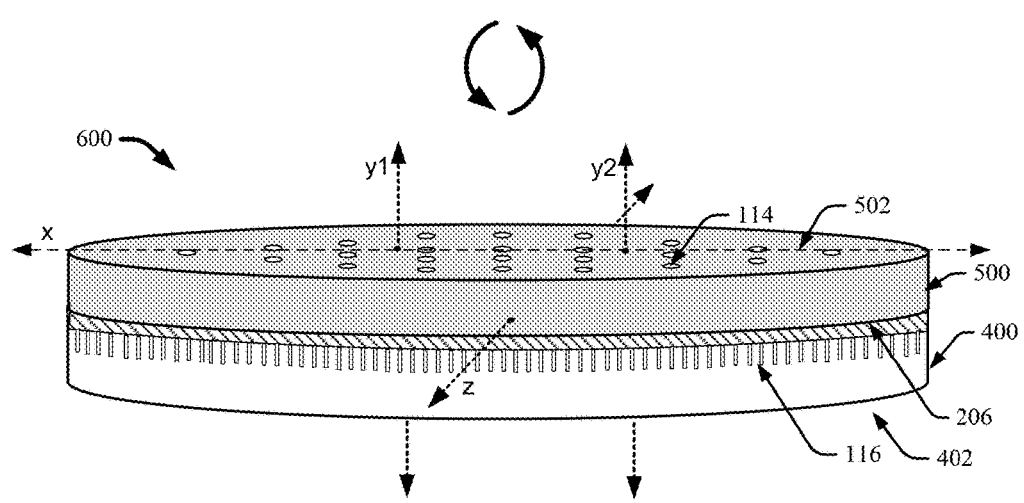
FIGS. 7A-7C depict alternative views of a bonded structure that facilitates wafer level integration of embedded cooling in accordance with one or more embodiments described herein.
Figure 7B:
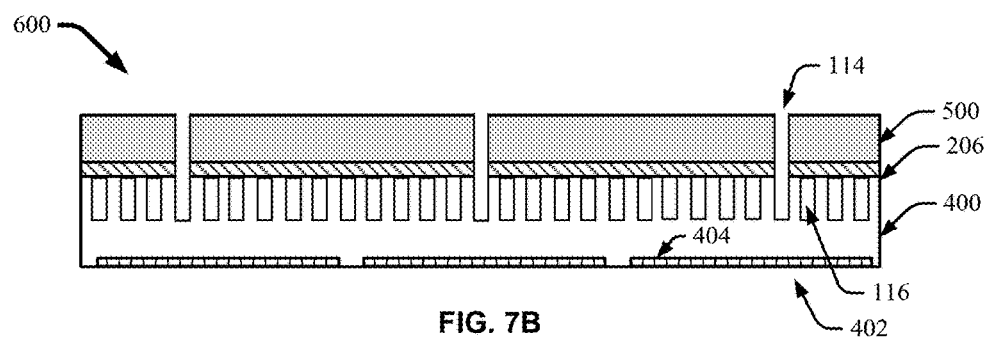
Figure 7C:
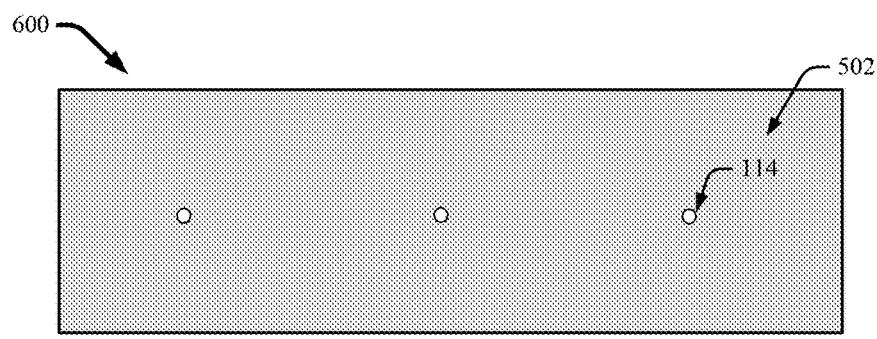

FIGS. 7A-7C depict alternative views of bonded structure 600. For example, FIG. 7A depicts a view of the bonded structure 600 shown in FIG. 6D flipped over. FIG. 7B depicts a 2D cross-sectional view of a portion of bonded structure 600 taken along the x-axis between points y1 and y2 shown relative to the bonded structure 600 in FIG. 7A. FIG. 7C depicts a 2D top-down planar view of a portion of bonded structure 600 taken along the z-axis between points y1 and y2 shown relative to the bonded structure 600 in FIG. 7A.

As shown in FIGS. 6D and 7A-7C, the bonded structure 600 comprises the manifold wafer 500 bonded to the first surface 401 of the silicon wafer 400 comprising the cooling channel structures 300. Thus the manifold wafer 500 provides a cap or cover so as to enclose the cooling channels 116 of the cooling channel structures 600 provided on the first surface 401 of the silicon wafer 400. The respective openings 114, which are aligned with the central fluid distribution areas 304 of the cooling channel structures 300, provide an inlet for liquid coolant into the cooling channels 116. The exposed second surface 502 of the manifold wafer 500 further includes the openings 114. The openings 114 extend through the manifold wafer 500 and the bonding layer 206. The second surface 402 of the silicon wafer 400 comprises the integrated circuits 404 formed thereon. The manifold wafer 500 is bonded to the silicon wafer 400 via the bonding layer 206. In embodiments in which the bonding layer 206 comprises a thermally conductive material, the bonding layer 206 facilitates enhance thermal conductance from heat generated by the integrated circuits 404 to the cooling channels 116.

FIGS. 8A-8D illustrate a method for forming individual chip structures with embedded cooling in accordance with one or more embodiments described herein. Repetitive description of like elements employed in other embodiments described herein is omitted for sake of brevity.

Figure 8A:
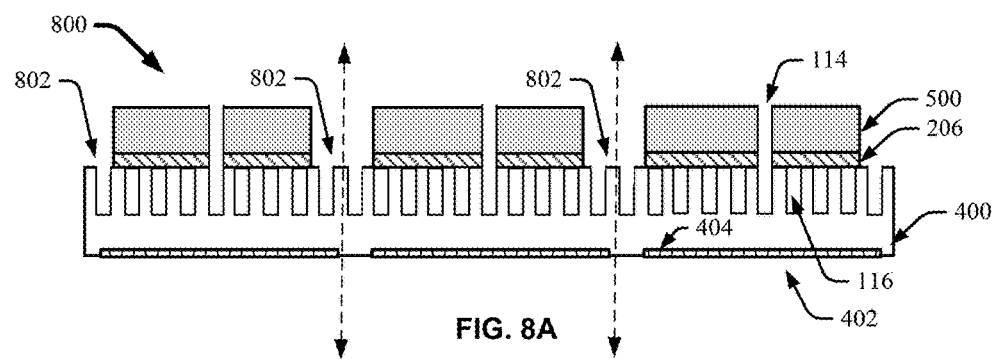
FIGS. 8A-8D illustrate a method for forming individual chip structures with embedded cooling in accordance with one or more embodiments described herein.
Figure 8B:
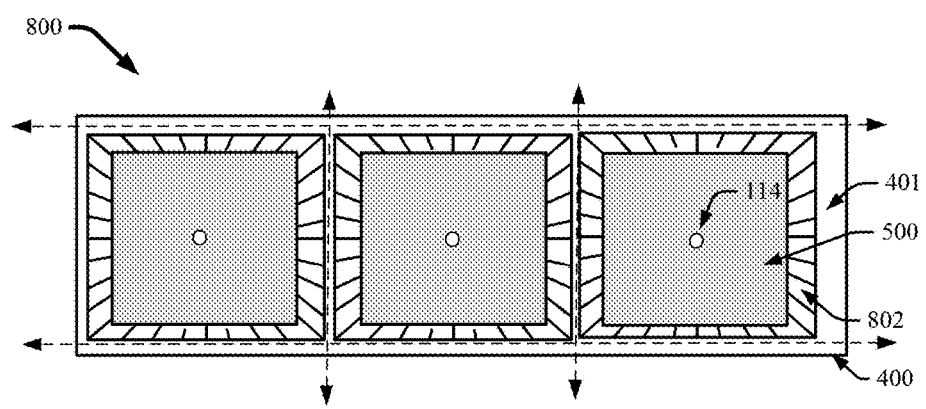

With reference to FIGS. 8A and 8B in one or more embodiments, a plurality of individual chip structures with embedded cooling can be formed using a dual dicing technique, wherein bonded structure 600 is diced in two phases. In accordance with the embodiment shown in FIGS. 8A and 8B, in the first phase, portions of the manifold wafer 500 and bonding layer 206 can be removed (i.e., via dicing, cutting, etched, etc.) so as to expose openings 802 in the cooling channels 116. FIG. 8A illustrates a cross-sectional view of a resulting intermediate structure 800 formed via the first dicing phase and FIG. 8B illustrates a top down view of the intermediate structure 800. In one or more embodiments, because the openings 802 open on a first surface 401 (e.g., as opposed to a side surface) of the silicon wafer 400, the openings 802 are configured to direct heated liquid coolant or vapor to flow in a vertical direction out of the cooling channels 116. For example, the openings 802 can be configured to direct liquid or vapor out of the radial channels in a direction about 90° relative to the first surface of the silicon wafer. In some embodiments, the openings 114 in the manifold wafer 500 can be formed at this first phase as well (e.g., in associating with forming the openings 802). According to these embodiments, the manifold wafer 500 of bonded structure 600 would not have openings 114.

Figure 8C:
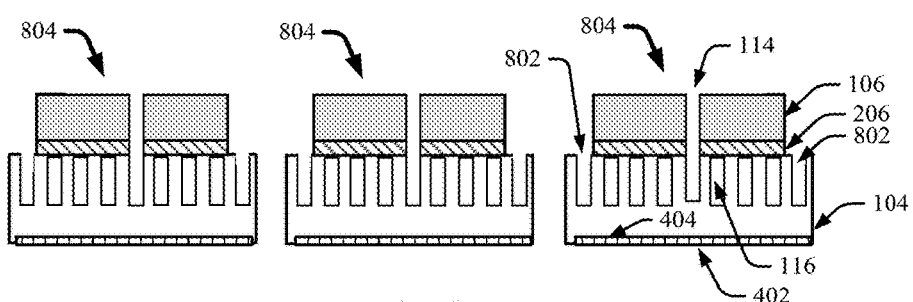
Figure 8D:
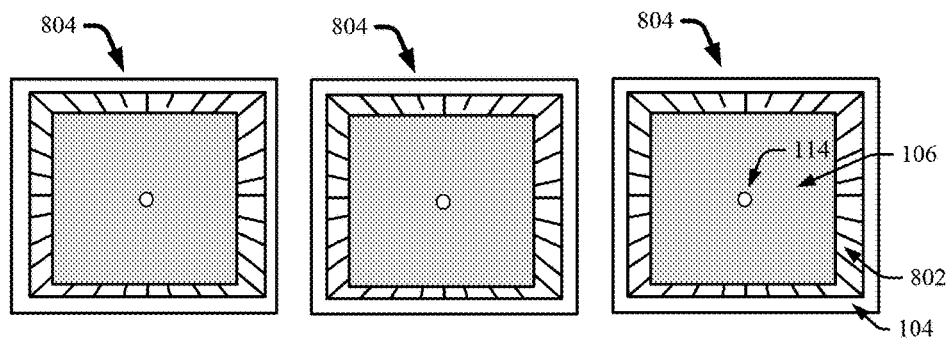

In the second dicing phase, the intermediate structure 800 can be separated into individual chip structures 804 by dicing (e.g., cutting, splitting, etc.) the silicon wafer 400 along the dashed arrowed lines. FIGS. 8C and 8D illustrate such individual chip structures 804 resulting from the second dicing phase. FIG. 8C illustrates a cross-sectional view and FIG. 8D illustrates a top-down planar view of chip structures 804. As shown in FIGS. 8C and 8D, each of the chip structures 804 include a chip 104 having cooling channels 116 provided on a first surface and at least one integrated circuit 404 provided on the opposing, second surface. The chip structures 804 further include a manifold 106 bonded to a portion of the first surface of chip via bonding layer 206. The manifold 106 thus encloses a portion of the cooling channels 116. Openings 802 in the cooling channels are established around the perimeter of manifold 106.

FIGS. 9A-9F illustrate another method for forming individual chip structures with embedded cooling in accordance with one or more embodiments described herein. Repetitive description of like elements employed in other embodiments described herein is omitted for sake of brevity.

Figure 9A:
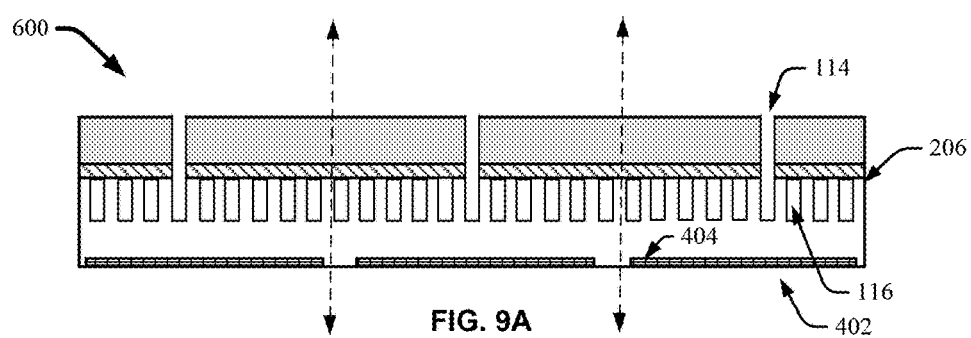
FIGS. 9A-9F illustrate another method for forming individual chips with embedded cooling in accordance with one or more embodiments described herein.
Figure 9B:
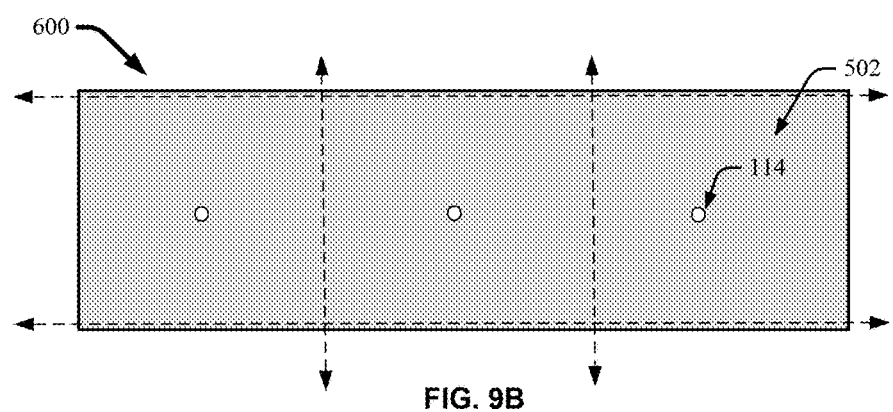
Figure 9C:
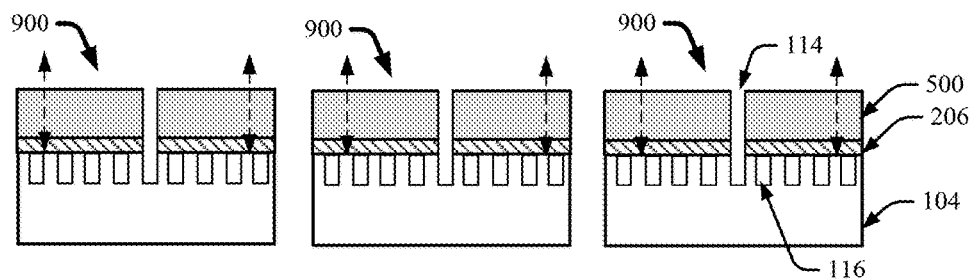
Figure 9D:
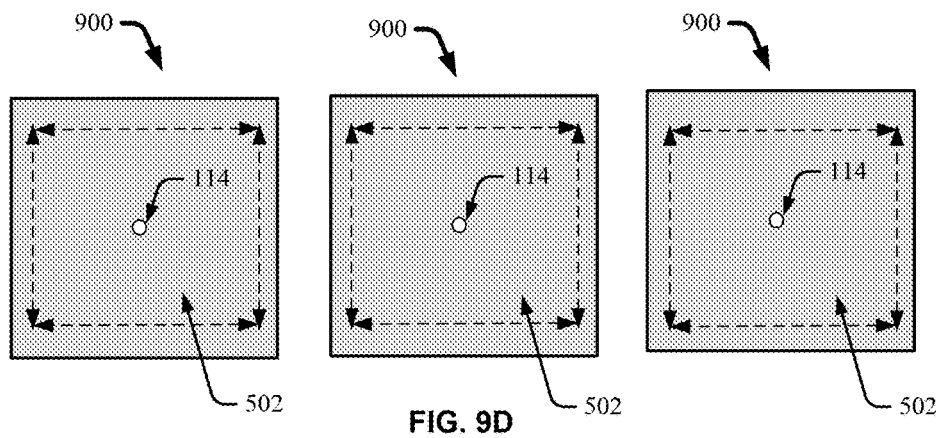
Figure 9E:
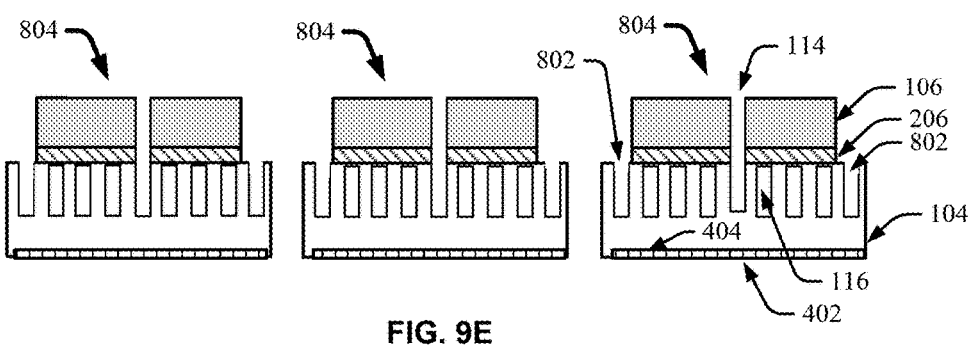
Figure 9F:
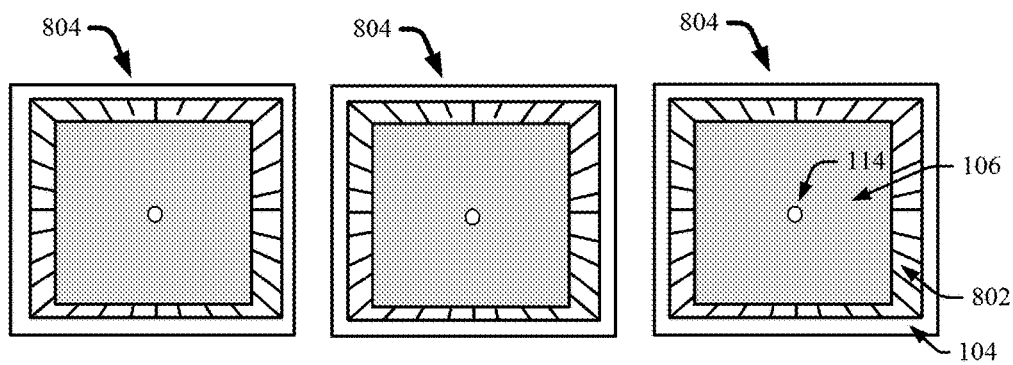

With reference to FIGS. 9A and 9B in another embodiment, a plurality of individual chip structures 804 with embedded cooling can be formed using a dual dicing technique wherein bonded structure 600 is diced in again two phases. However, in accordance with this other embodiment as shown in FIGS. 9A and 9B, in the first phase, portions of the entire bonded structure 600 can be diced (e.g., cut, split, etc.) along dashed arrow lines to generate intermediate structures 900 shown in FIGS. 9C and 9D. The intermediate structures 900 can further be diced (e.g., via etching, dicing, cutting, etc.) in a second phase along the dashed arrow lines shown on intermediate structures 900 so as to expose openings 802 in the cooling channels 116. The resulting chip structures 804 are shown in FIGS. 9E and 9F. In one or more embodiments, because the openings 802 open on a top surface (e.g., as opposed to a side surface) of the manifold 106, the openings 802 are configured to direct heated liquid coolant or vapor to flow in a vertical direction out of the cooling channels 116. In some embodiments, the openings 114 in the manifold wafer 500 can be formed at this first phase as well. According to these embodiments, the manifold wafer 500 of bonded structure 600 and the intermediate structures 900 would not have openings 114.

Figure 10A:
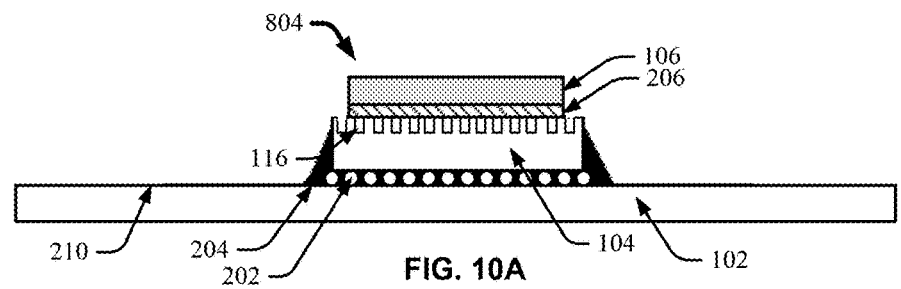
FIGS. 10A-10C illustrate a method for assembly of a device having an integrated cooling architecture to implement two-phase cooling in accordance with one or more embodiments described herein.
Figure 10B:
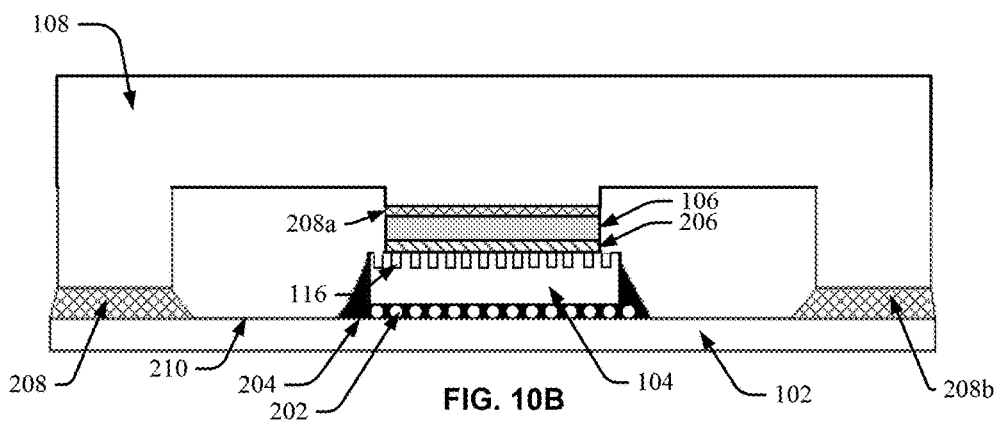
Figure 10C:
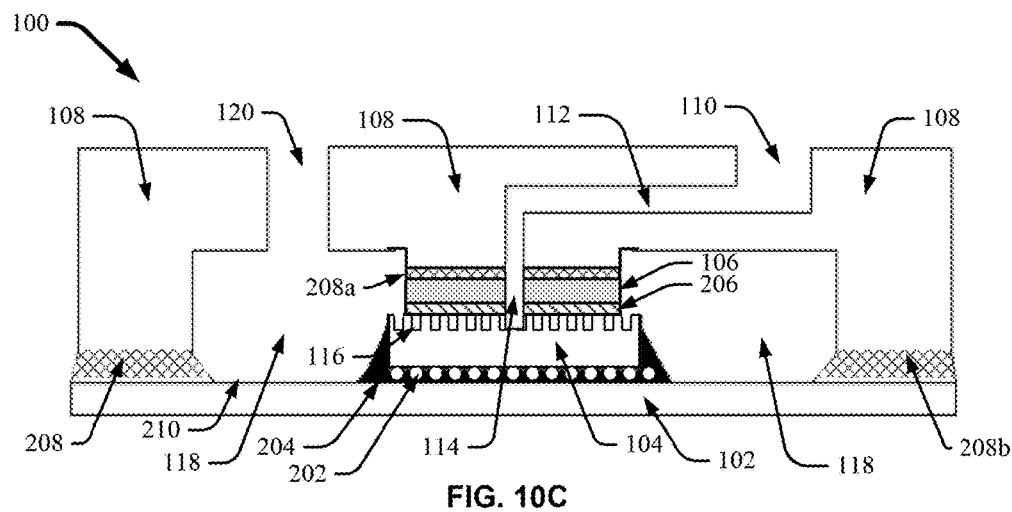

FIGS. 10A-10C illustrate a method for assembly of a chip package (e.g., chip package 100) having an integrated cooling architecture to implement two-phase cooling in accordance with one or more embodiments described herein. Repetitive description of like elements employed in other embodiments described herein is omitted for sake of brevity.

As shown in FIG. 10A, the chip structure 804 can be mounted onto a substrate 102 (e.g., via the side of the chip comprising the at least one integrated circuit 404) by underfilling the chip 104 with cured underfill 204 in conjunction with solder balls 202 (e.g., Pb free C4s). In some implementations the chip structure 804 and the substrate 102 can also be prepared for attaching the cap 108. For example, oxygen plasma treatment of the chip structure and the substrate 102 before application of the interface 208 can help to clean and to enhance coating, wetting, and adhesion. Further, the cap 108 can be cleaned using, for example, ultrasonic cleaning techniques. Further, in some embodiments, the portions of the substrate around the mounted chip structure 804 can be laminated with a laminate 210 coat.

As shown in 10B, the cap 108 can then be applied so as to enclose the chip structure on the substrate 102 via interfaces 208. For example, the interface 208 can be applied to first position 208a on the manifold 106 and to a second position 208b on the substrate 102. Wherein the interface 208 can be an adhesive at the first position 208a, the adhesive can be applied in a pattern to achieve maximum coverage while avoiding any overflow into the cooling channels 116 or central fluid distribution area. Wherein the interface 208 can be a pre-cast or pre-cut seal, the seal can be positioned so as to surround the opening 114 in the manifold 106. As described above in regards to the structure of the chip package 100, the interface 208, at the first position 208a, can be any one of a rigid adhesive, a compliant adhesive, or a pre-cast or pre-cut non-adhesive seal. As shown in FIG. 10C, the chip package 100 can be finalized by establishing the at least one inlet opening 110, the outlet opening 120, the inlet path 112 and the outlet path 118.

Figure 11:
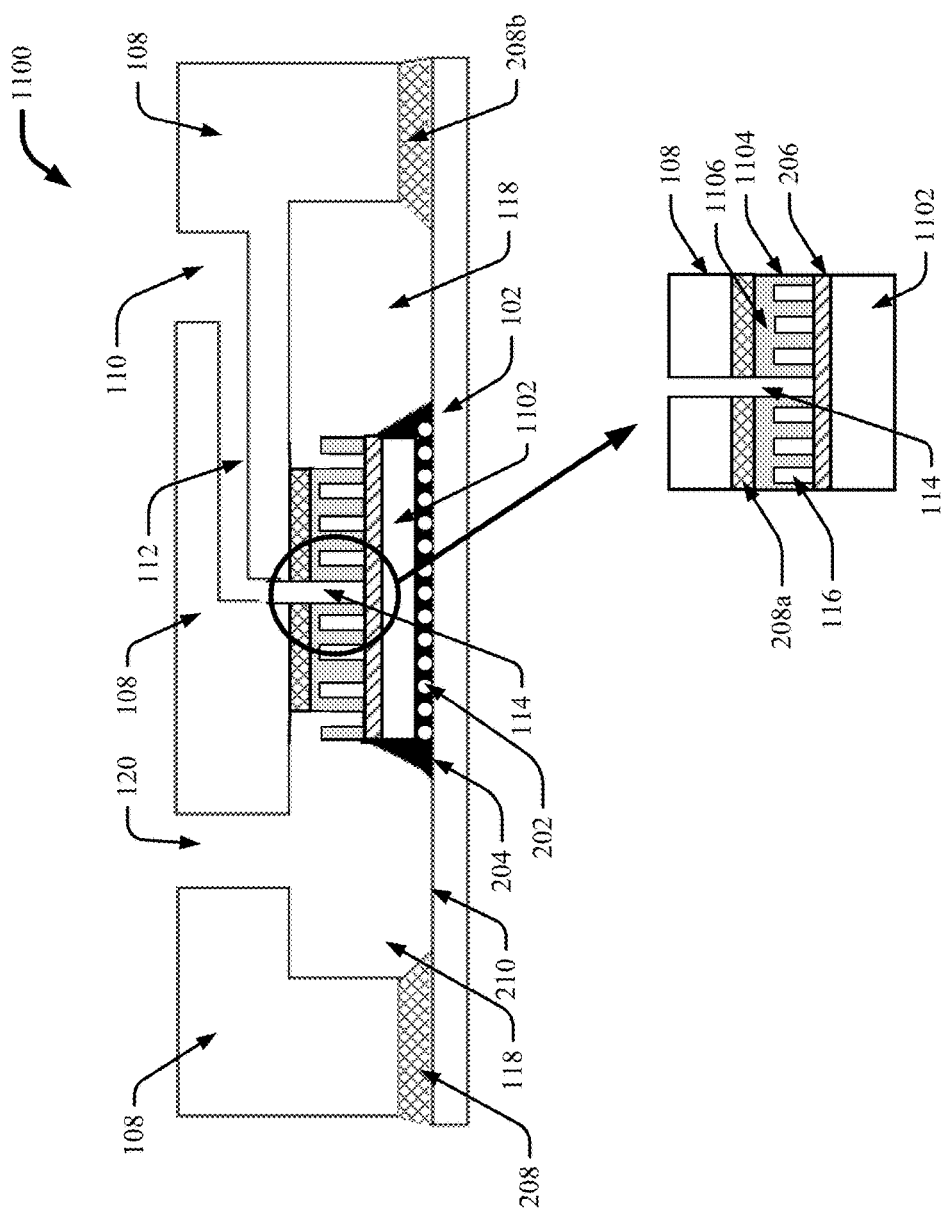
FIG. 11 illustrates a schematic of another example, non-limiting device having an integrated cooling architecture to implement two-phase cooling in accordance with one or more embodiments described herein.

FIG. 11 illustrates a cross-sectional view of another example chip package 1100 in accordance with one or more embodiments disclosed herein. Repetitive description of like elements employed in other embodiments described herein is omitted for sake of brevity.

Chip package 1100 includes same or similar elements as chip package 100 with the exception of the chip structure including the embedded cooling. In particular, as shown in the enlarged view of circled area, the chip structure with the embedded cooling comprises a chip 1102 bonded to a manifold 1104 via a bonding layer 206. Similar to chip 104, chip 1102 can include at least one integrated circuit (not shown) formed on a surface thereof. In some implementations, the integrated circuit can be formed on the bottom surface of the chip 1102 contacting the substrate 102 via the solder balls 202 and cured underfill 204. In other implementations, the integrated circuit can be formed on the top surface of the chip 1102 contacting the bonding layer 206. Still in other implementations, the integrated circuit can be formed within the middle of the chip 1102.

Unlike chip 104, the chip 1102 does not include the cooling channels 116. On the contrary, the cooling channels 116 are formed in the manifold 1104. The manifold 1104 can include same or similar materials as the manifold 106. In the embodiment shown, the cooling channels 116 can extend partially through the manifold 1104 from the lower surface of the manifold 1104 such that they do not puncture through the opposing top surface of the manifold 1104. For example, the depth of the cooling channels 116 can vary within the thickness of the manifold 1104 such that at a portion 1106 of the manifold 1104 encloses the cooling channels 116. Similar to chip package 100, the opening 114 can further pass through the interface 208 and the cap 108 and connect to the inlet channel 112. An opening 114 can be formed through at least a portion of the manifold 1104 that connects to the cooling channels 116. In some embodiments, the cooling channels 116 can extend entirely through the thickness of the manifold 1104. In accordance with chip package 1100, the bonding layer 206 can be made with a thermally conductive material to facilitate conducting heat from the integrated circuit on the chip 1102 (and other electrical components) to the cooling channels 1116.

Figure 12A:
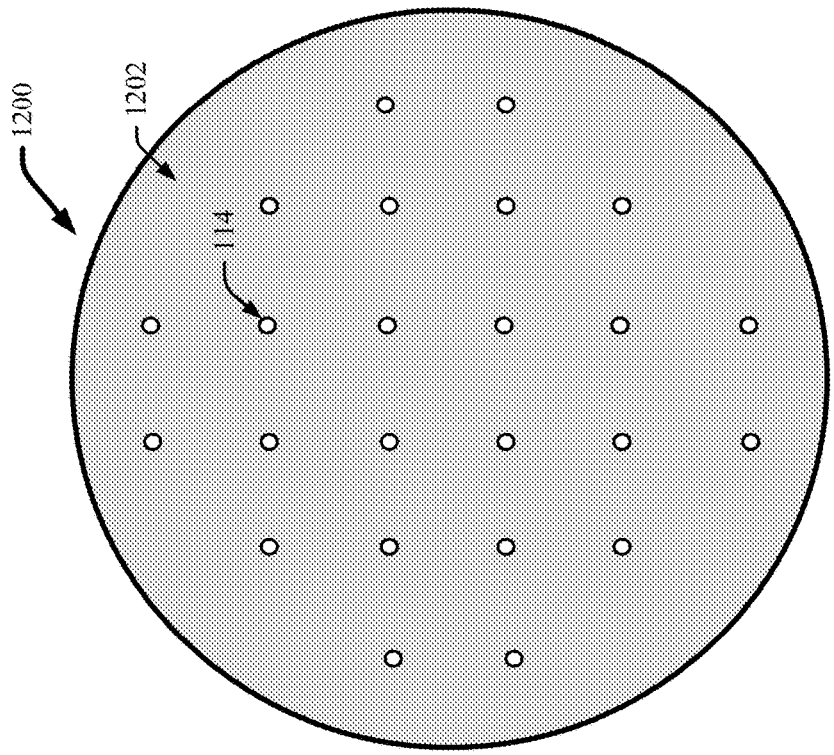
FIGS. 12A and 12B illustrate top-down planar views of another example manifold wafer in accordance with one or more embodiments described herein.
Figure 12B:
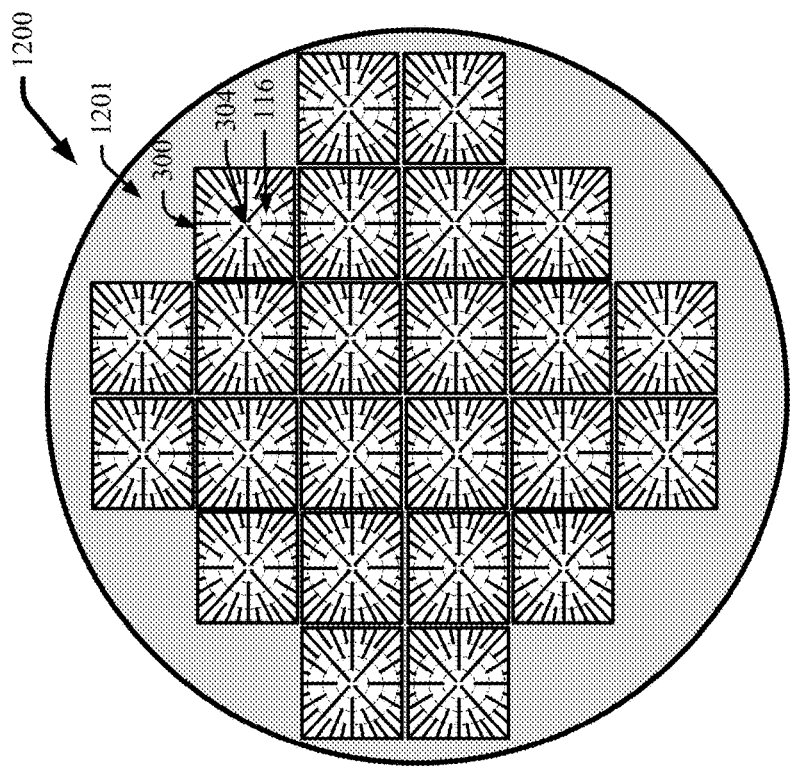

FIGS. 12A and 12B illustrate top-down planar views of another example manifold wafer 1200 in accordance with one or more embodiments described herein. FIG. 12A illustrates a first surface 1201 of the manifold wafer and FIG. 12B illustrates a second surface 1202 of the manifold wafer 1200. The first surface 1201 opposes the second surface 1202. As shown in FIG. 12A, similar to the first surface 401 of silicon wafer 400, the first surface 1201 of the manifold wafer 1200 can comprises a plurality of cooling channel structures 300 formed thereon. The cooling channels 116 of the cooling channel structures can be exposed. Similar to the first surface 501 of the manifold wafer 500, the second surface 1202 of the manifold wafer 1200 can include a plurality of openings 114. The plurality of openings 114 can respectively extend through a portion of the manifold wafer 1200 and respectively connect to the central fluid distribution areas 304 of cooling channel structures 300 formed on the opposing, first surface 1201 of the manifold wafer. Repetitive description of like elements employed in embodiments described herein is omitted for sake of brevity.

In some embodiments, the manifold wafer 1200 can be formed by etching the cooling channel structures 300 on the first surface 1201 of the manifold wafer 1200 (e.g., using a suitable etching technique such as RIE, a wet etchant, or the like). The openings 114 can further be formed (e.g., using a suitable etching technique such as RIE, a wet etchant, or the like) through the second surface 1202 of the manifold wafer 1200 such that the openings 114 respectively align with and connect to the central fluid distribution areas 304. In other embodiments, the manifold wafer 1200 can be formed by etching the openings 114 in the second surface 1202 of the manifold wafer 1200 partially or entirely through the thickness of the manifold wafer 1200. The cooling channel structures 300 can further be etched on the first surface 1201 of the manifold such that the central fluid distribution areas 304 respectively align with and connect to the openings.

Figure 13A:
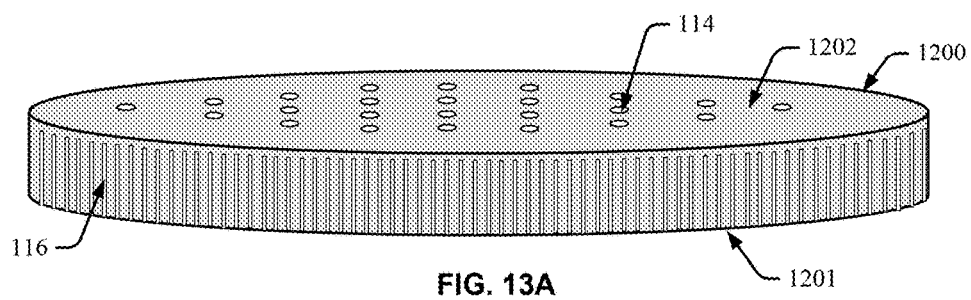
FIGS. 13A-13C illustrate another example method for wafer level integration of embedded cooling in accordance with one or more embodiments described herein.
Figure 13B:
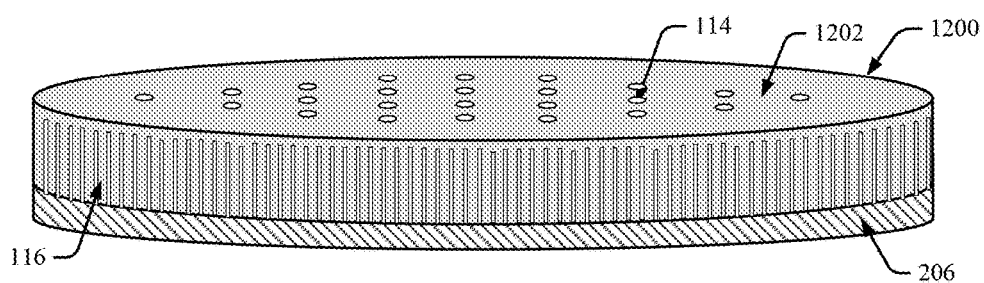
Figure 13C:
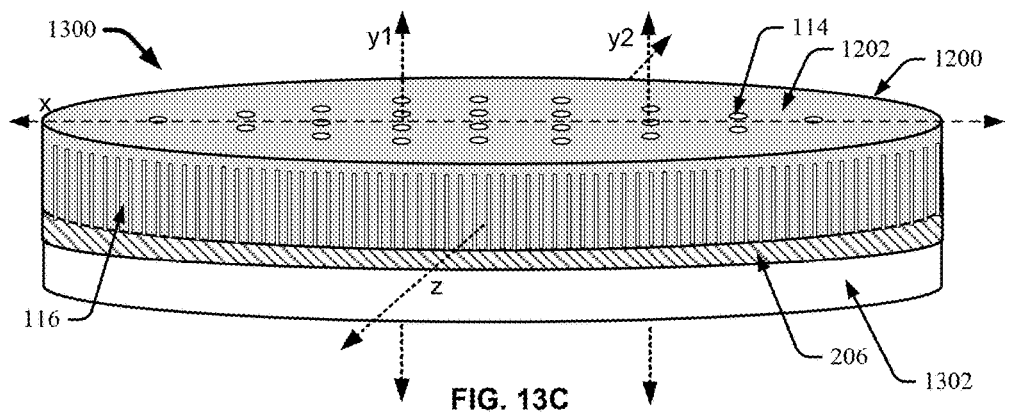

FIGS. 13A-13C illustrate a method for wafer level integration of embedded cooling in accordance with one or more embodiments described herein. Repetitive description of like elements employed in other embodiments described herein is omitted for sake of brevity.

With reference to FIGS. 13A and 13B, according to the embodiment shown, a bonding layer 206 can be formed on the first surface 1201 of the manifold wafer 1200 comprising the exposed cooling channels 116. In implementations in which the manifold wafer 1200 comprises silicon, the bonding layer 206 can comprise a copper bond, a solder bond, or an adhesive bond. In other implementations in which the manifold wafer 1200 comprises glass, the bonding layer 206 can comprise a copper bond, a solder bond, or an adhesive bond. In various exemplary implementations, the bonding layer 206 comprises a thermally conductive material. Other suitable materials for the bonding layer 206 are discussed supra with reference to FIG. 2. Although the bonding layer 206 is shown substantially covering the first surface 1201 of the manifold wafer 500, it should be appreciated that the amount of coverage of the bonding layer 206 on first surface 1201 of the manifold wafer 1200 can cover less than the entire surface based on the type of bonding material/method used. For example, in some implementations, the bonding layer 206 can be formed on the surfaces of the walls 302 of the respective cooling channel structures 300.

As shown in FIG. 13C, the first surface a silicon wafer 1302 can be bonded to the manifold wafer 1200 via the bonding layer 206, thereby generating bonded structure 1300. Similar to the second surface 402 of silicon wafer 400, at least one surface (or intermediary layer) of the silicon wafer 1302 can comprise a plurality of integrated circuits 404 formed thereon (not shown). The integrated circuits can respectively align with the respective cooling channel structures 300 formed on the first surface 1201 of the manifold wafer 1200. In some implementations, the integrated circuits can be formed on the bottom surface of the silicon wafer 1302 opposite the top surface of the silicon wafer 1302 bonded to the manifold wafer 1200 (via the bonding layer 206). In other embodiments, the integrated circuits can be formed on the top surface of the silicon wafer that opposes the bottom surface of the silicon wafer 1302. By bonding the first surface 1201 of the manifold wafer 1200 to the silicon wafer 1302, the exposed cooling channels 116 are enclosed.

In other implementations, (not shown), the bonding layer 206 can be formed on the top surface of the silicon wafer 1302. The first surface 1201 of the manifold wafer 1200 can further be bonded to the silicon wafer 1302 by pressing the first surface 1201 of the manifold wafer 1200 onto the top surface of the silicon wafer 1302 comprising the bonding layer 206 formed thereon, thereby resulting in the bonded structure 1300.

Figure 14A:
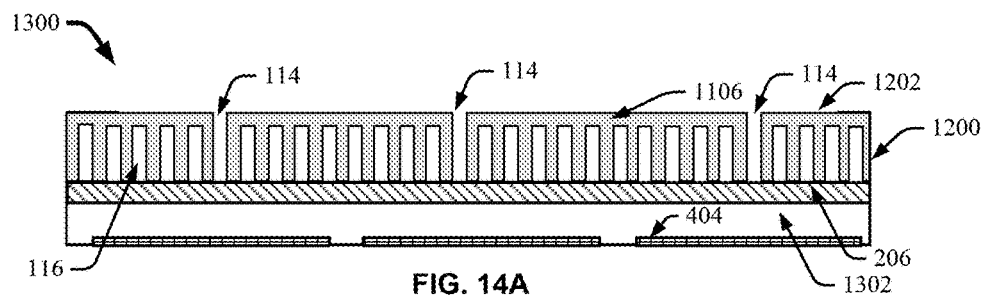
FIGS. 14A-14C depict alternative views of a bonded structure that facilitates wafer level integration of embedded cooling in accordance with one or more embodiments described herein.
Figure 14B:
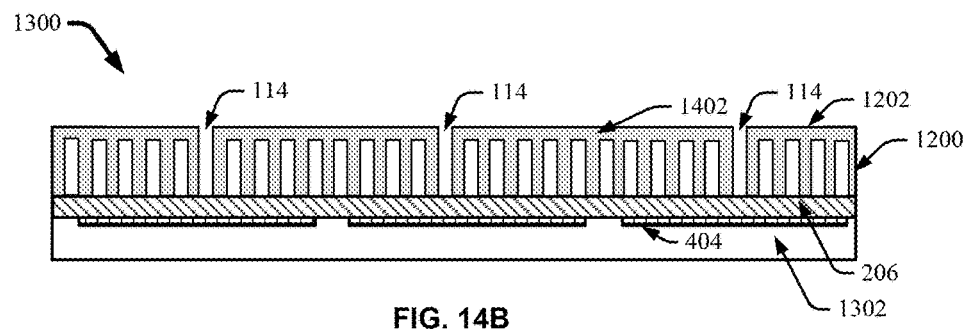
Figure 14C:
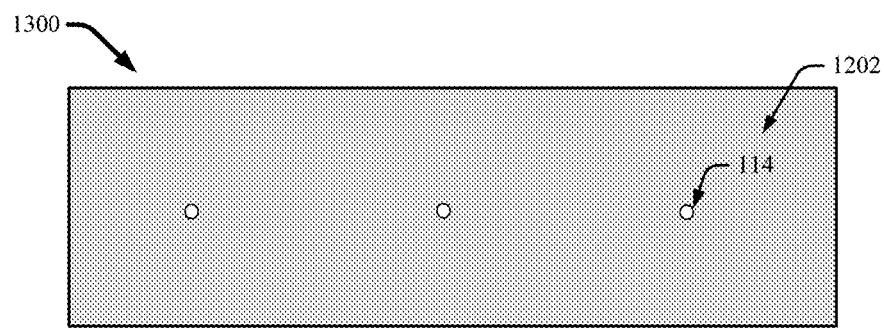

FIGS. 14A-14C depict alternative views of bonded structure 1300. For example, FIGS. 13A and 13B depict a 2D cross-sectional view of a portion of bonded structure 600 taken along the x-axis between points y1 and y2 shown relative to the bonded structure 1300 in FIG. 13C. FIG. 13A illustrates an embodiment wherein the integrated circuits 404 are formed on a bottom surface of the silicon wafer 1302, and FIG. 13B illustrates an embodiment wherein the integrated circuits 404 are formed on a top surface of the silicon wafer 1302. FIG. 13C depicts a 2D top-down planar view of a portion of bonded structure 1300 taken along the z-axis between points y1 and y2 shown relative to the bonded structure 1300 in FIG. 13C.

As shown in FIGS. 13C and 14A-14C, the bonded structure 1300 comprises the manifold wafer 1200 bonded to the silicon wafer 1302 such that the first surface 1201 of the manifold wafer 1200 comprising the exposed cooling channels 116 contacts a top surface of the silicon wafer 1302 (e.g., via the bonding layer 206). Thus the silicon wafer 1302 provides a cap or cover so as to enclose the cooling channels 116. Further, the respective openings 114, which are aligned with the central fluid distribution areas 304 of the cooling channel structures 300, provide an inlet for liquid coolant into the cooling channels 116. In embodiments in which the bonding layer comprises a thermally conductive material, the bonding layer 206 facilitates enhance thermal conductance from heat generated by the integrated circuits 404 to the cooling channels 116.

FIGS. 15A-15D illustrate a method for forming individual chip structures with embedded cooling in accordance with one or more embodiments described herein. Repetitive description of like elements employed in other embodiments described herein is omitted for sake of brevity.

Figure 15A:
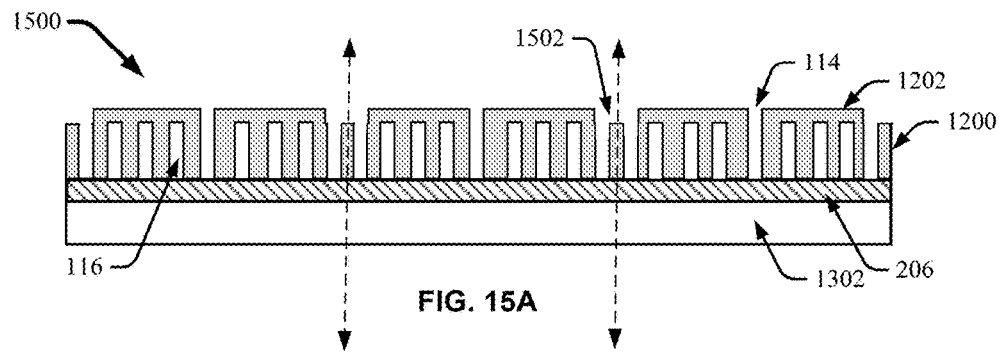
FIGS. 15A-15D illustrate another method for forming individual chip structures with embedded cooling in accordance with one or more embodiments described herein.
Figure 15B:
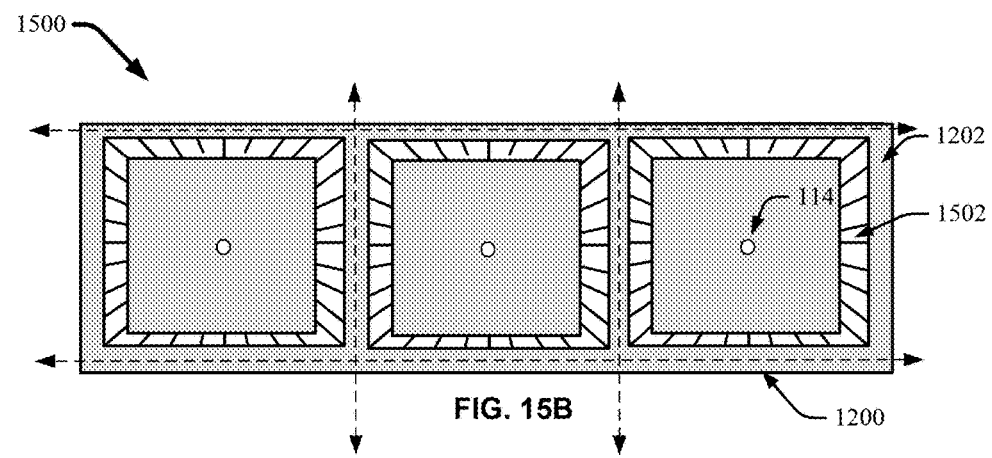

With reference to FIGS. 15A and 15B in one or more embodiments, a plurality of individual chip structures with embedded cooling can be formed using a dual dicing technique, wherein bonded structure 1300 is diced in two phases. In accordance with the embodiment shown in FIGS. 15A and 15B, in the first phase, portions of the manifold wafer 1200 can be removed (i.e., via etching, dicing, cutting, etc.) so as to expose openings 1502 in the cooling channels 116. FIG. 15A illustrates a cross-sectional view of a resulting intermediate structure 1500 formed via the first dicing phase and FIG. 15B illustrates a top down view of the intermediate structure 1500. In one or more embodiments, because the openings 1502 open on a first surface 1201 (e.g., as opposed to a side surface) of the manifold wafer 1200, the openings 1502 are configured to direct heated liquid coolant or vapor to flow in a vertical direction out of the cooling channels 116. In some embodiments, the openings 114 in the manifold wafer 1200 can be formed at this first phase as well (e.g., in association with formation of the openings 1502). According to these embodiments, the manifold wafer 1200 of bonded structure 1300 would not have openings 114.

Figure 15C:
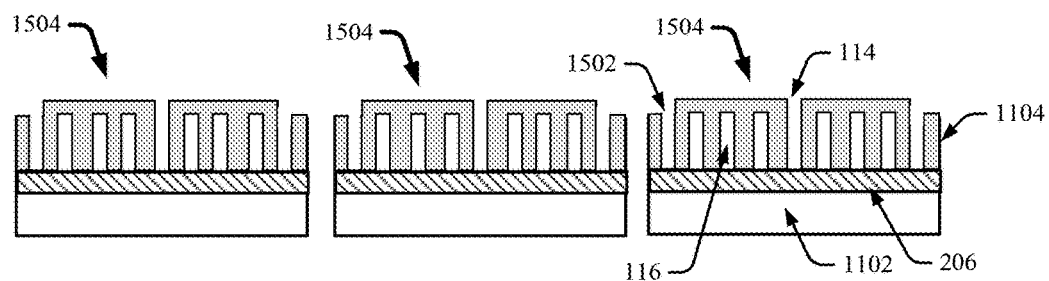
Figure 15D:
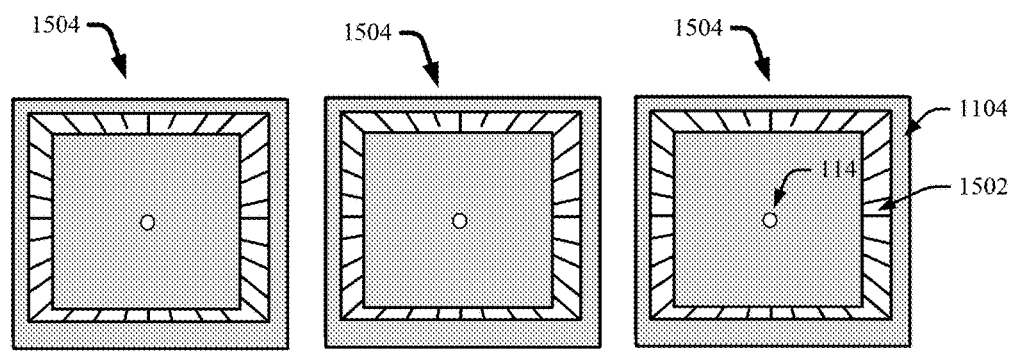

In the second dicing phase, the intermediate structure 1500 can be separated into individual chip structures 1504 by dicing (e.g., cutting, splitting, etc.) the manifold wafer 1200, the bonding layer 206 and the silicon wafer 1302 along the dashed arrowed lines shown in FIGS. 15A and 15B. FIGS. 15C and 15D illustrate such individual chip structures 1504 resulting from the second dicing phase. FIG. 15C illustrates a cross-sectional view and FIG. 15D illustrates a top-down planar view of chip structures 1504. As shown in FIGS. 15C and 15D, each of the chip structures 1504 include a chip 104 having cooling channels 116 provided within a manifold 1104 with an opening 114 that connects to the cooling channels (e.g., via the central fluid distribution area 304). The chip structures 1504 further include a chip 1102 bonded to the surface of the manifold 1104 comprising the cooling channels 116. Openings 1502 in the cooling channels 116 are established around the perimeter of manifold 1104.

FIGS. 16A-16F illustrate another method for forming individual chip structures with embedded cooling in accordance with one or more embodiments described herein. Repetitive description of like elements employed in other embodiments described herein is omitted for sake of brevity.

Figure 16A:
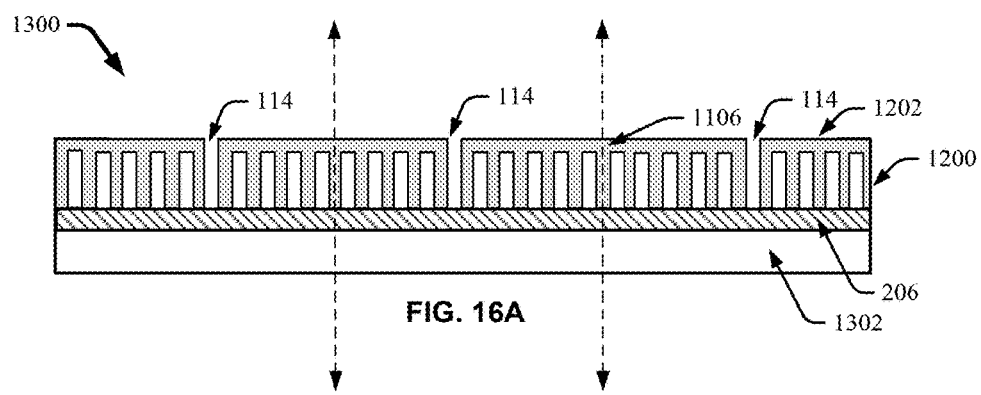
FIGS. 16A-16F illustrate another method for forming individual chips with embedded cooling in accordance with one or more embodiments described herein.
Figure 16B:
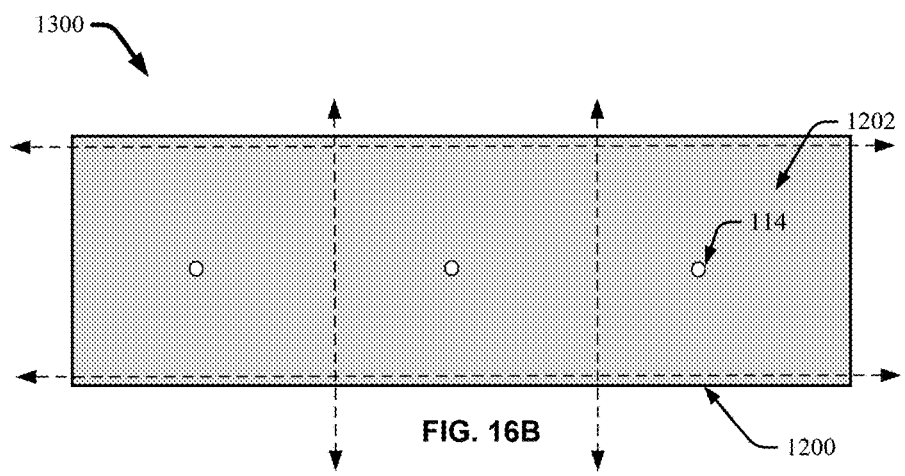
Figure 16C:
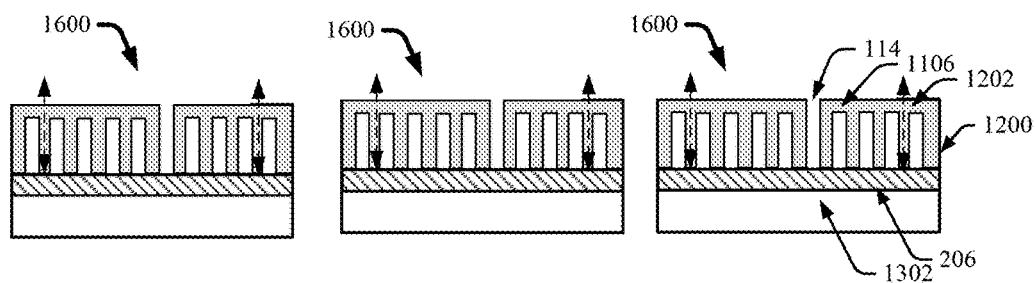
Figure 16D:
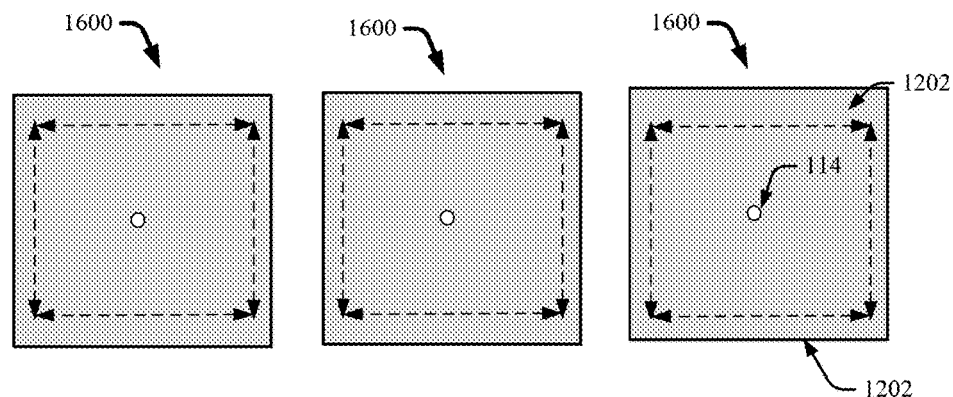
Figure 16E:
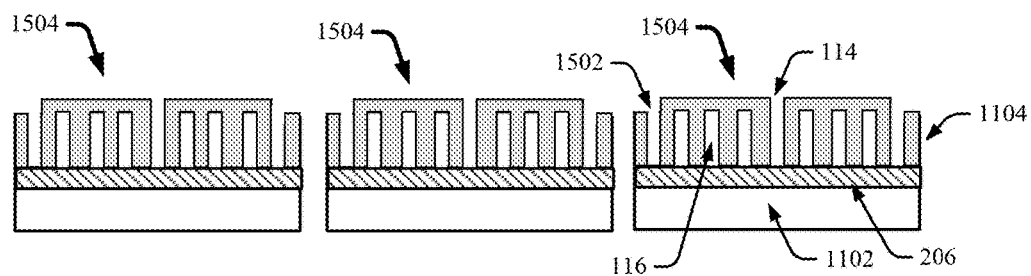
Figure 16F:
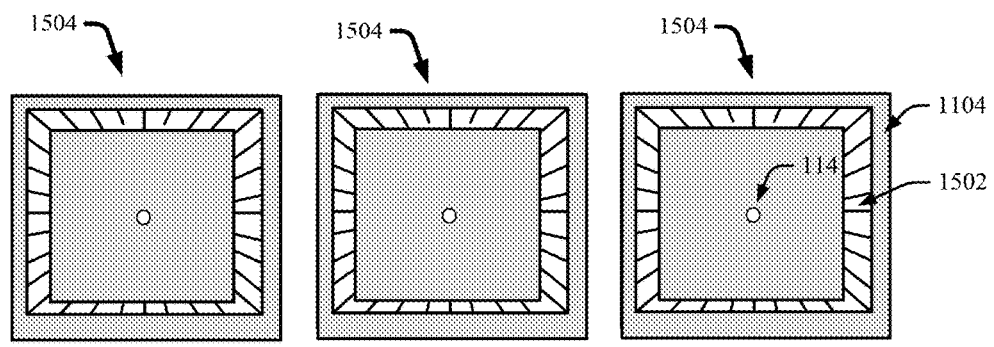

With reference to FIGS. 16A and 16B in another embodiment, a plurality of individual chip structures 1504 with embedded cooling can be formed using a dual dicing technique wherein bonded structure 1300 is diced in again two phases. However, in accordance with this other embodiment as shown in FIGS. 16A and 16B, in the first phase, portions of the entire bonded structure 1300 can be diced (e.g., cut, split, etc.) along the dashed arrow lines shown in FIGS. 16A and 16B to generate intermediate structures 1600 shown in FIGS. 16C and 16D. The intermediate structures 1600 can further be diced (e.g., via etching, dicing, cutting, etc.) in a second phase along the dashed arrow lines shown on intermediate structures 1600 of FIGS. 16C and 16D so as to expose openings 1502 in the cooling channels 116. The resulting chip structures 1504 are shown in FIGS. 16E and 16F. In one or more embodiments, because the openings 1502 open on a top surface (e.g., as opposed to a side surface) of the manifold 1104, the openings 1502 are configured to direct heated liquid coolant or vapor to flow in a vertical direction out of the cooling channels 116. In some embodiments, the openings 114 in the manifold wafer 1200 can be formed at this first phase as well. According to these embodiments, the manifold wafer 1200 of bonded structure 1300 and the intermediate structures 1600 would not have openings 114.

Figure 17A:
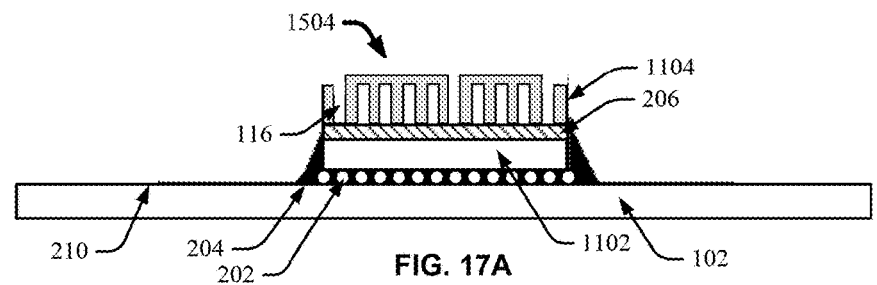
FIGS. 17A-17C illustrate another method for assembly of a device having an integrated cooling architecture to implement two-phase cooling in accordance with one or more embodiments described herein.
Figure 17B:
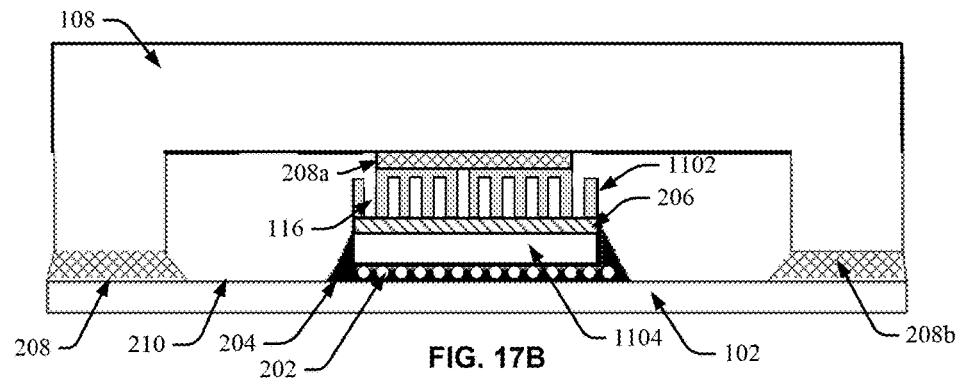
Figure 17C:
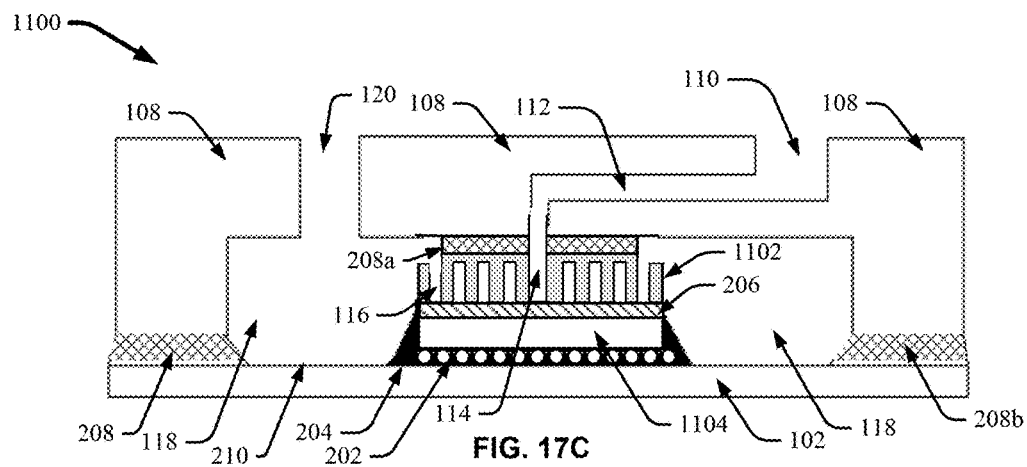

FIGS. 17A-17C illustrate a method for assembly of a chip package (e.g., chip package 1100) having an integrated cooling architecture to implement two-phase cooling in accordance with one or more embodiments described herein. Repetitive description of like elements employed in other embodiments described herein is omitted for sake of brevity.

As shown in FIG. 17A, the chip structure 1504 can be mounted onto a substrate 102 (e.g., via the chip 1102) by underfilling the chip 1102 with cured underfill 204 in conjunction with solder balls 202 (e.g., Pb free C4s). In some implementations the chip structure 1504 and the substrate 102 can also be prepared for attaching the cap 108. For example, oxygen plasma treatment of the chip structure and the substrate 102 before application of the interface 208 can help to clean and to enhance coating, wetting, and adhesion. Further, the cap 108 can be cleaned using, for example, ultrasonic cleaning techniques. Further, in some embodiments, the portions of the substrate around the mounted chip structure 1504 can be laminated with a laminate 210 coat.

As shown in 17B, the cap 108 can then be applied so as to enclose the chip structure 1504 on the substrate 102 via interfaces 208. For example, the interface 208 can be applied to first position 208a on the manifold 1104 and to a second position 208b on the substrate 102. Wherein the interface 208 can be an adhesive at the first position 208a, the adhesive can be applied in a pattern to achieve maximum coverage while avoiding any overflow into the cooling channels 116 or central fluid distribution area. Wherein the interface 208 can be a pre-cast or pre-cut seal, the seal can be positioned so as to surround the opening 114 in the manifold 1104. As described above in regards to the structure of the chip package 1100, the interface 208, at the first position 208a, can be any one of a rigid adhesive, a compliant adhesive, or a pre-cast or pre-cut non-adhesive seal. As shown in FIG. 17C, the chip package 1100 can be finalized by establishing the at least one inlet opening 110, the outlet opening 120, the inlet path 112 and the outlet path 118.

FIGS. 18-23 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts can occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with the disclosed subject matter.

Figure 18:
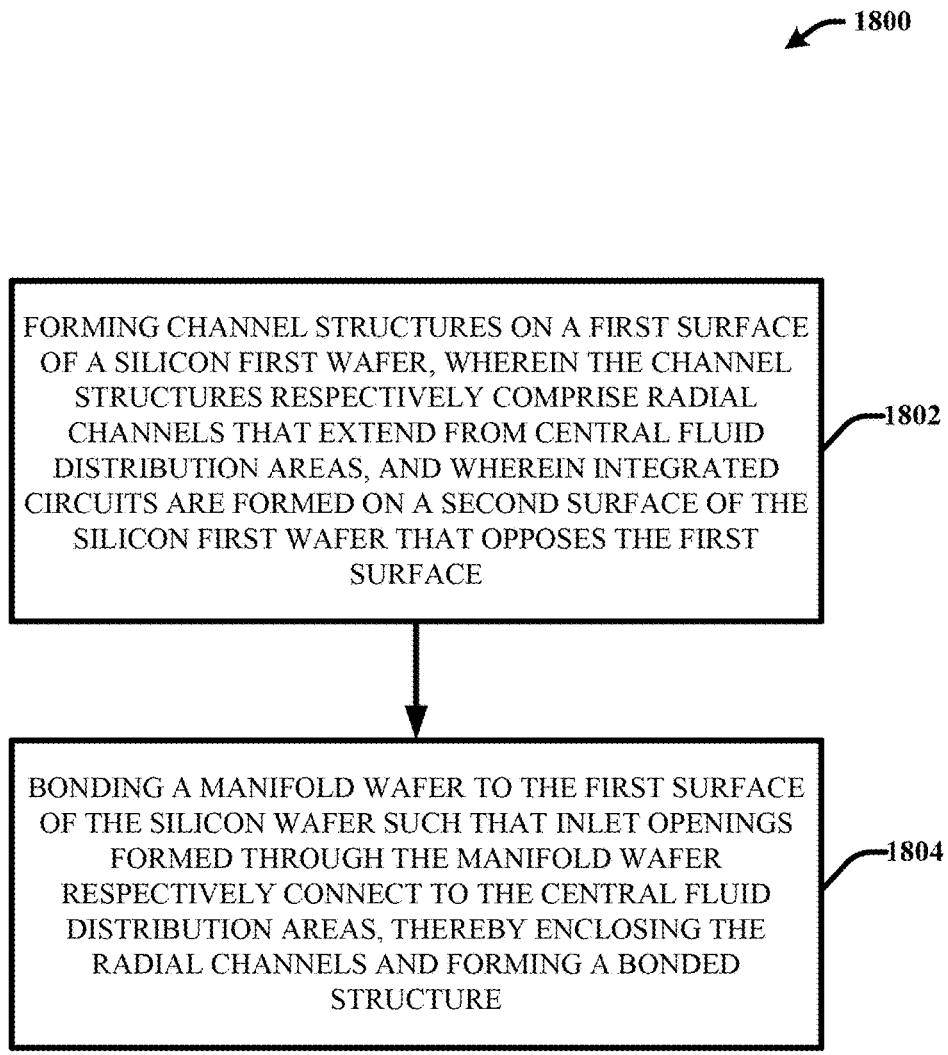
FIG. 18 illustrates a flow diagram of an example, non-limiting method for wafer level integration of embedded cooling in accordance with one or more embodiments described herein.

FIG. 18 illustrates a flow diagram of an example, non-limiting method for wafer level integration of embedded cooling in accordance with one or more embodiments described herein. Repetitive description of like elements employed in other embodiments described herein is omitted for sake of brevity.

At 1802, channel structures (e.g., cooling channel structures 300) are formed on a first surface (e.g., first surface 401) of a silicon first wafer (silicon wafer 400), wherein the channel structures respectively comprise radial channels (e.g., cooling channels 116) that extend from central fluid distribution areas (e.g., central fluid distribution areas 304), and wherein integrated circuits (e.g., integrated circuits 404) are formed on a second surface (e.g., second surface 402) of the silicon first wafer that opposes the first surface. At 1804, a manifold wafer (e.g., manifold wafer 500) is bonded to the first surface of the silicon wafer such that inlet openings (e.g., openings 114) formed through the manifold wafer respectively connect to the central fluid distribution areas, thereby enclosing the radial channels and forming a bonded structure (e.g., bonded structure 600).

Figure 19:
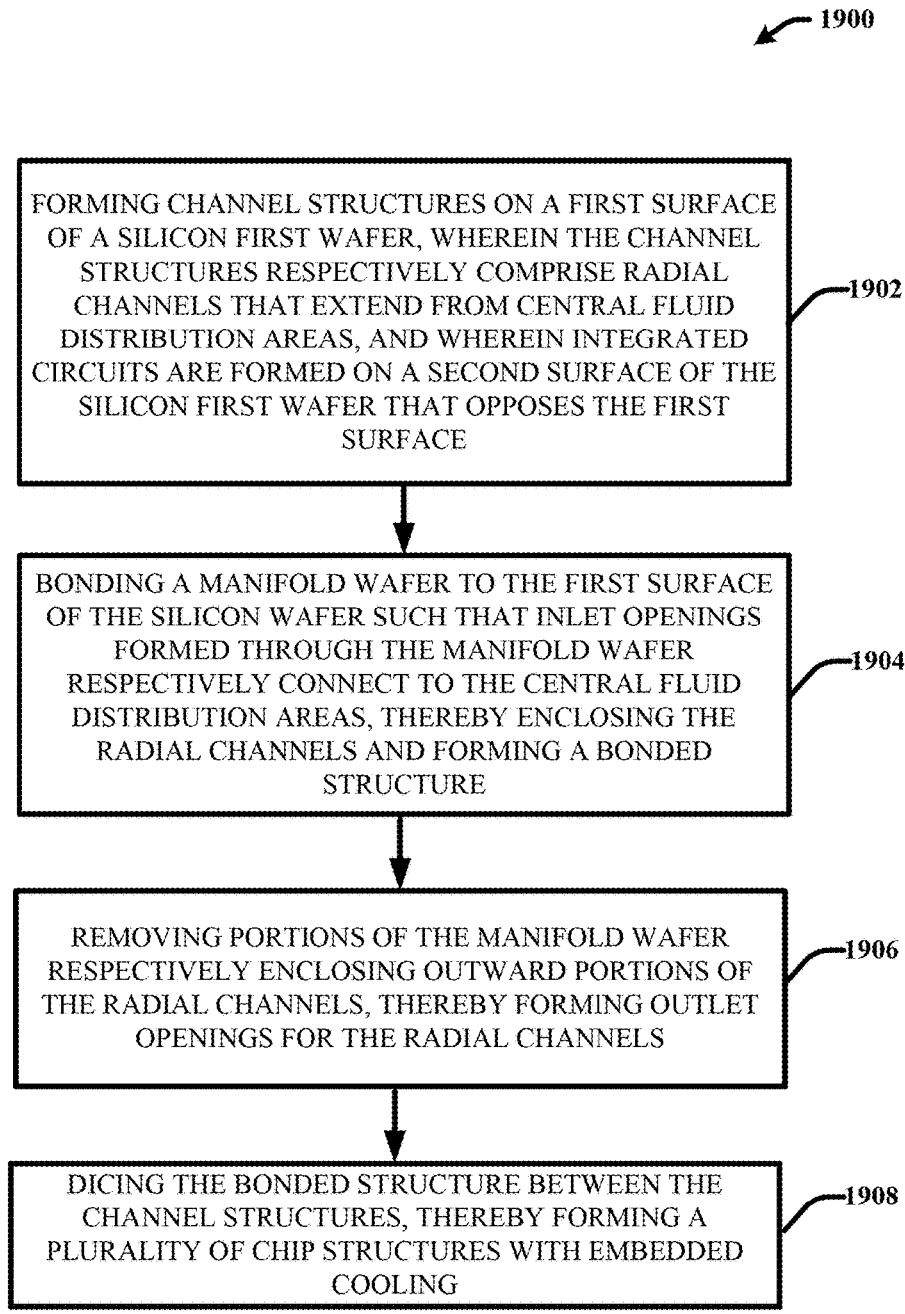
FIG. 19 illustrates a flow diagram of another example, non-limiting method for wafer level integration of embedded cooling in accordance with one or more embodiments described herein.

FIG. 19 illustrates a flow diagram of another example, non-limiting method for wafer level integration of embedded cooling in accordance with one or more embodiments described herein. Repetitive description of like elements employed in other embodiments described herein is omitted for sake of brevity.

At 1902, channel structures (e.g., cooling channel structures 300) are formed on a first surface (e.g., first surface 401) of a silicon first wafer (silicon wafer 400), wherein the channel structures respectively comprise radial channels (e.g., cooling channels 116) that extend from central fluid distribution areas (e.g., central fluid distribution areas 304), and wherein integrated circuits (e.g., integrated circuits 404) are formed on a second surface (e.g., second surface 402) of the silicon first wafer that opposes the first surface. At 1904, a manifold wafer (e.g., manifold wafer 500) is bonded to the first surface of the silicon wafer such that inlet openings (e.g., openings 114) formed through the manifold wafer respectively connect to the central fluid distribution areas, thereby enclosing the radial channels and forming a bonded structure (e.g., bonded structure 600). At 1906, portions of the manifold wafer respectively enclosing outward portions of the radial channels are removed, thereby forming outlet openings (e.g., openings 802) for the radial channels. At 1908, the bonded structure (e.g., intermediate structure 800) is diced between the channel structures (e.g., along the dashed lines shown on intermediate structure 800 in FIGS. 8A and 8B), thereby forming a plurality of chip structures with embedded cooling (e.g., chip structures 804).

Figure 20:
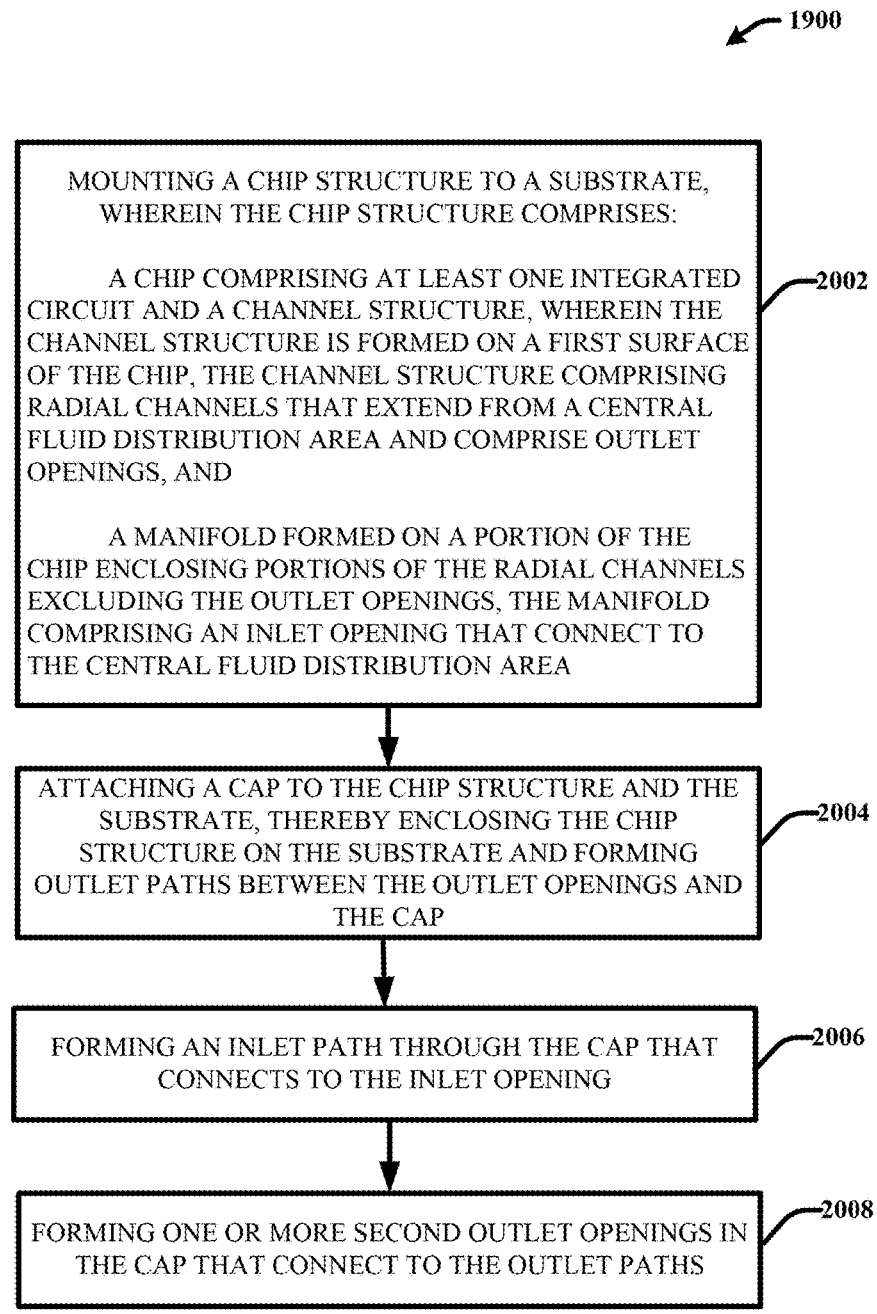
FIG. 20 illustrates a flow diagram of another example, non-limiting method for wafer level integration of embedded cooling in accordance with one or more embodiments described herein.

FIG. 20 illustrates a flow diagram of another example, non-limiting method for wafer level integration of embedded cooling in accordance with one or more embodiments described herein. Repetitive description of like elements employed in other embodiments described herein is omitted for sake of brevity.

At 2002, a chip structure is mounted to a substrate (e.g., chip structure 804). The chip structure comprise a chip (e.g., chip 104), that includes least one integrated circuit (e.g., integrated circuit 404), and a channel structure (e.g., cooling channel structure 300), wherein the channel structure is formed on a first surface of the chip. The channel structure comprises radial channels (e.g., cooling channels 116) that extend from a central fluid distribution area (e.g., central fluid distribution area 304), and comprise outlet openings (e.g., openings 802), and a manifold (e.g., manifold 106) formed on a portion of the chip enclosing portions of the radial channels excluding the outlet openings. The manifold also comprises an inlet opening (e.g., opening 114) that connect to the central fluid distribution area. At 2004, a cap (e.g., cap 108) is attached to the chip structure and the substrate, thereby enclosing the chip structure on the substrate and forming outlet paths (e.g., outlet paths 118) between the outlet openings and the cap. At 2006, forming an inlet path (e.g., inlet path 112) is formed through the cap that connects to the inlet opening, and at 2008, one or more second outlet openings (e.g., outlet opening 120) are formed in the cap that connect to the outlet paths.

Figure 21:
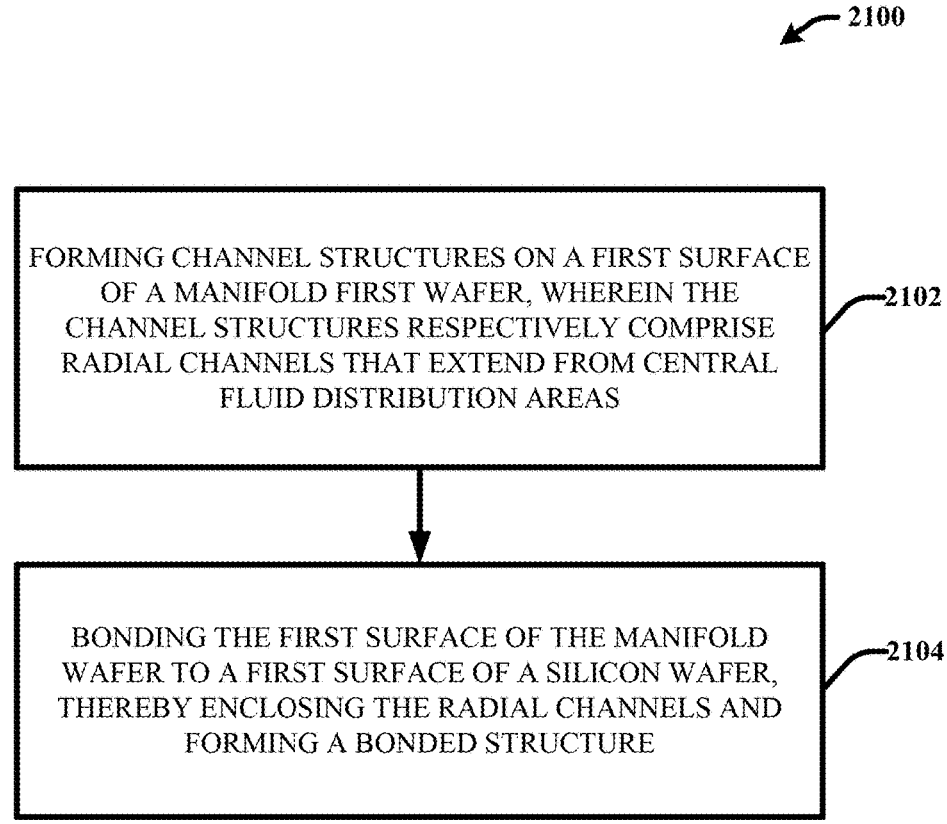
FIG. 21 illustrates a flow diagram of another example, non-limiting method for wafer level integration of embedded cooling in accordance with one or more embodiments described herein.

FIG. 21 illustrates a flow diagram of another example, non-limiting method for wafer level integration of embedded cooling in accordance with one or more embodiments described herein. Repetitive description of like elements employed in other embodiments described herein is omitted for sake of brevity.

At 2102, channel structures (e.g., cooling channel structures 300) are formed on a first surface (e.g., first surface 1201) of a manifold first wafer (e.g., manifold wafer 1200), wherein the channel structures respectively comprise radial channels (e.g., cooling channels 116) that extend from central fluid distribution areas (e.g., central fluid distribution areas 304). At 1204, and the first surface of the manifold wafer is bonded to a first surface of a silicon wafer (e.g., silicon wafer 1302), thereby enclosing the radial channels and forming a bonded structure (e.g., bonded structure 1300).

Figure 22:
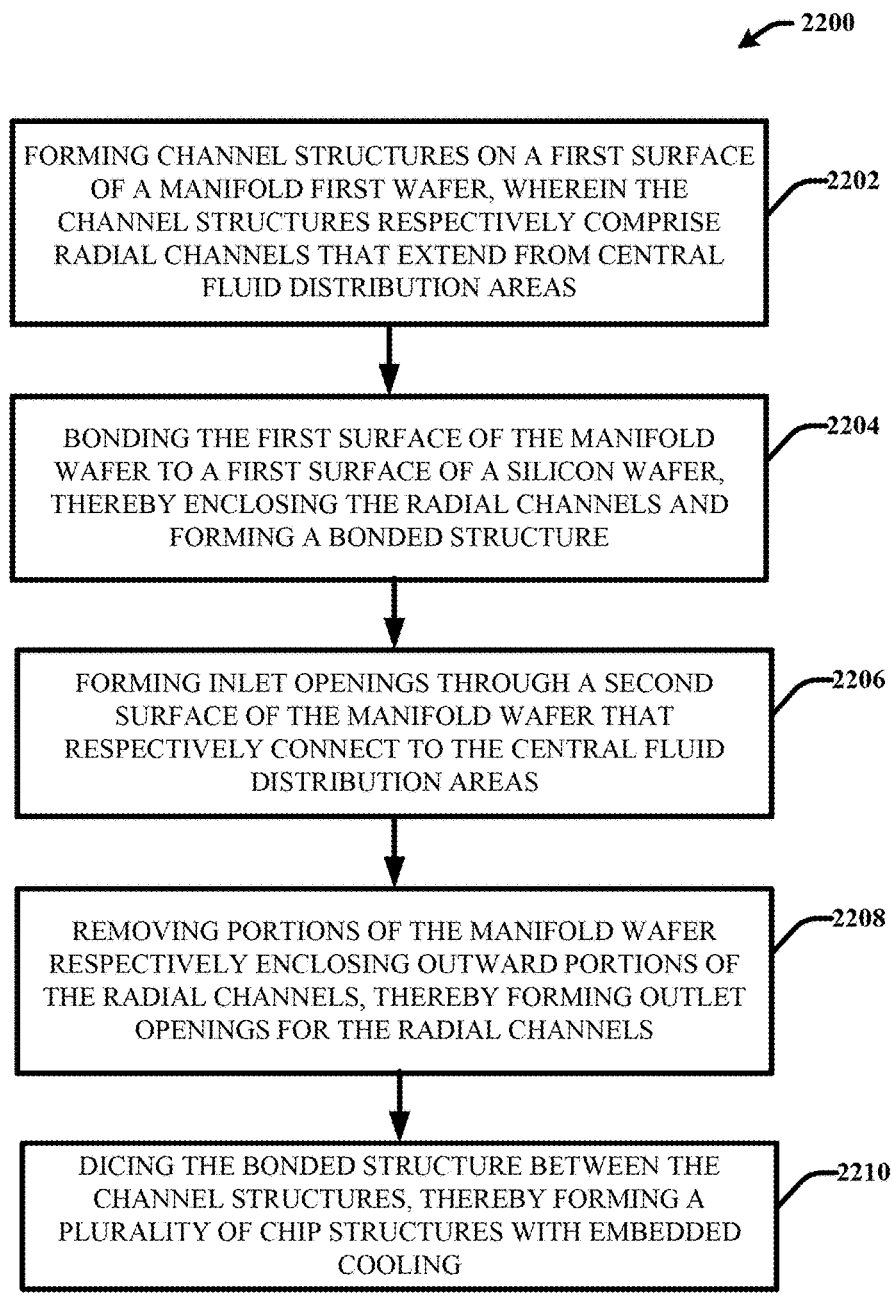
FIG. 22 illustrates a flow diagram of another example, non-limiting method for wafer level integration of embedded cooling in accordance with one or more embodiments described herein.

FIG. 22 illustrates a flow diagram of another example, non-limiting method for wafer level integration of embedded cooling in accordance with one or more embodiments described herein. Repetitive description of like elements employed in other embodiments described herein is omitted for sake of brevity.

At 2202, channel structures (e.g., cooling channel structures 300) are formed on a first surface (e.g., first surface 1201) of a manifold first wafer (e.g., manifold wafer 1200), wherein the channel structures respectively comprise radial channels (e.g., cooling channels 116) that extend from central fluid distribution areas (e.g., central fluid distribution areas 304). At 2204, and the first surface of the manifold wafer is bonded to a first surface of a silicon wafer (e.g., silicon wafer 1302), thereby enclosing the radial channels and forming a bonded structure (e.g., bonded structure 1300). At 2206, inlet openings (e.g., openings 114) are formed through a second surface (e.g., second surface 1202) of the manifold wafer, wherein the inlet openings respectively connect to the central fluid distribution areas. At 2208, portions of the manifold wafer respectively enclosing outward portions of the radial channels are removed, thereby forming outlet openings (e.g., openings 1502) for the radial channels. At 2210, the bonded structure (e.g., intermediate structure 1500) is diced between the channel structures (e.g., along the dashed lines indicated in FIGS. 15A and 15B), thereby forming a plurality of chip structures with embedded cooling (e.g., chip structures 1504).

Figure 23:
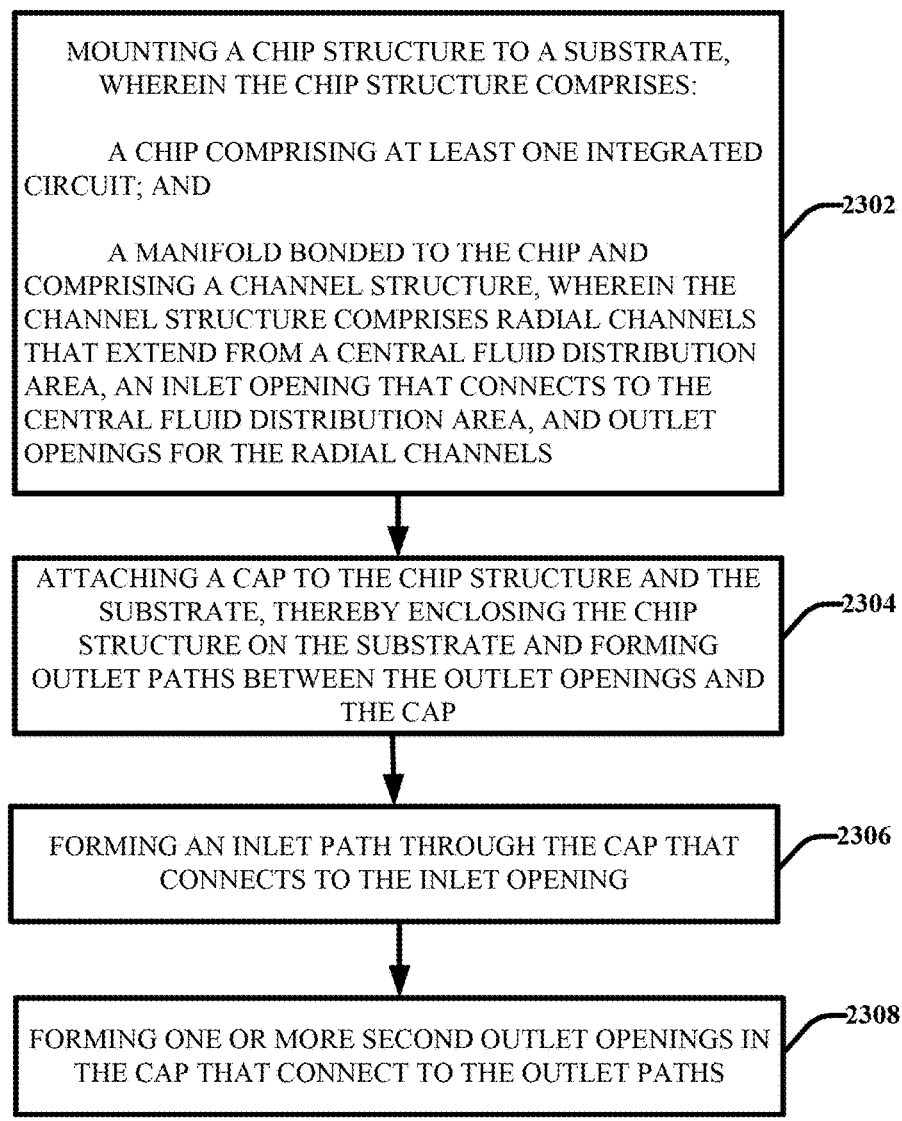
FIG. 23 illustrates a flow diagram of another example, non-limiting method for wafer level integration of embedded cooling in accordance with one or more embodiments described herein.

FIG. 23 illustrates a flow diagram of another example, non-limiting method for wafer level integration of embedded cooling in accordance with one or more embodiments described herein. Repetitive description of like elements employed in other embodiments described herein is omitted for sake of brevity.

At 2302, a chip structure is mounted to a substrate (e.g., chip structure 1504). The chip structure comprise a chip (e.g., chip 1102), that includes least one integrated circuit (e.g., integrated circuit 404), and a manifold (e.g., manifold 1104) bonded to the chip. The manifold comprises a channel structure (e.g., cooling channel structure 300), that comprises channel comprises radial channels (e.g., cooling channels 116) that extend from a central fluid distribution area (e.g., central fluid distribution area 304), an inlet opening (e.g., opening 114) that connects to the central fluid distribution area, and outlet openings (e.g., openings 1502), for the radial channels. At 2304, a cap (e.g., cap 108) is attached to the chip structure and the substrate, thereby enclosing the chip structure on the substrate and forming outlet paths (e.g., outlet paths 118) between the outlet openings and the cap. At 2306, forming an inlet path (e.g., inlet path 112) is formed through the cap that connects to the inlet opening, and at 2008, one or more second outlet openings (e.g., outlet opening 120) are formed in the cap that connect to the outlet paths.

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:
1. A device, comprising:
a silicon wafer, comprising:
  channel structures formed on a first surface of a silicon first wafer, wherein the channel structures respectively comprise radial channels that extend from central fluid distribution areas; and
  integrated circuits formed on a second surface of the silicon first wafer that opposes the first surface; and
a manifold wafer bonded to the first surface of the silicon wafer, wherein portions of the manifold wafer enclose the radial channels and wherein inlet openings formed through the manifold wafer respectively connect to the central fluid distribution areas.

2. The device of claim 1, further comprising:
a thermally conductive bonding layer formed between the silicon wafer and the manifold wafer.

3. The device of claim 1, wherein the silicon wafer comprises a plurality of integrated circuits formed on the silicon wafer.

4. The device of claim 1, wherein the silicon wafer comprises a plurality of integrated circuits formed within the silicon wafer.

5. The device of claim 1, further comprising an inlet path that receives liquid coolant, wherein the inlet opening distributes the liquid coolant to the radial channels,
  outlet openings that expel vapor generated from the liquid coolant within the radial channels into outlet paths.

6. The device of claim 5, further comprising outlet openings that expel vapor generated from the liquid coolant within the radial channels into outlet paths.

7. The device of claim 2, wherein the thermally conductive bonding layer is comprised of copper.

8. The device of claim 2, wherein the thermally conductive bonding layer is comprised of an adhesive.

9. The device of claim 8, wherein the adhesive comprises a phenoxy thermoplastic adhesive.

* * * * *